United States Patent [19]
Kimura et al.

[11] Patent Number: 6,034,374
[45] Date of Patent: Mar. 7, 2000

[54] THERMAL INFRARED SENSORS, IMAGING DEVICES, AND MANUFACTURING METHODS FOR SUCH SENSORS

[75] Inventors: Mitsuteru Kimura, Miyaghi-ken; Kenji Udagawa, Ushiku, both of Japan

[73] Assignee: Nikon Corporation, Tokyo, Japan

[21] Appl. No.: 08/967,532

[22] Filed: Nov. 10, 1997

[30] Foreign Application Priority Data

Nov. 8, 1996 [JP] Japan ................................. 8-296494
Sep. 8, 1997 [JP] Japan ................................. 9-242675

[51] Int. Cl.[7] ................................................ H01L 27/144
[52] U.S. Cl. ............... 250/370.08; 250/332; 250/338.4; 250/370.01
[58] Field of Search ...................... 250/370.08, 332, 250/338.4, 370.01

[56] References Cited

U.S. PATENT DOCUMENTS 5,010,251  4/1991  Grinberg et al. ..................... 250/332
5,777,328  7/1998  Gooch ................................. 250/332

OTHER PUBLICATIONS

Marshall et al., "Uncooled Infrared Sensor With Digital Focal Plane Array," *SPIE* 2746: 23–31 (1996).

*Primary Examiner*—Constantine Hannaher
*Assistant Examiner*—Andrew Israel
*Attorney, Agent, or Firm*—Klarquist Sparkman Ca mpbell Leigh & Whinston, LLP

[57] ABSTRACT

Thermal infrared sensors are disclosed for the detection of an incident infrared flux. The sensors include an absorber each including an absorption layer and a thermal sensing element. The incident infrared flux is absorbed by the absorption layer. Heat generated by the absorption is detected by the thermal sensing element such as a thermistor. The absorber is supported above a substrate by supports and bridges, reducing heat transfer from the absorber to the substrate. The supports and bridges include electrical connections to the absorber and the substrate. The supports and bridges are located beneath the absorber so that a large proportion of the area of the absorber is available to absorb the incident flux. Imaging devices including arrays of such sensors and fabrication methods for the sensors and imaging devices are also disclosed.

11 Claims, 21 Drawing Sheets

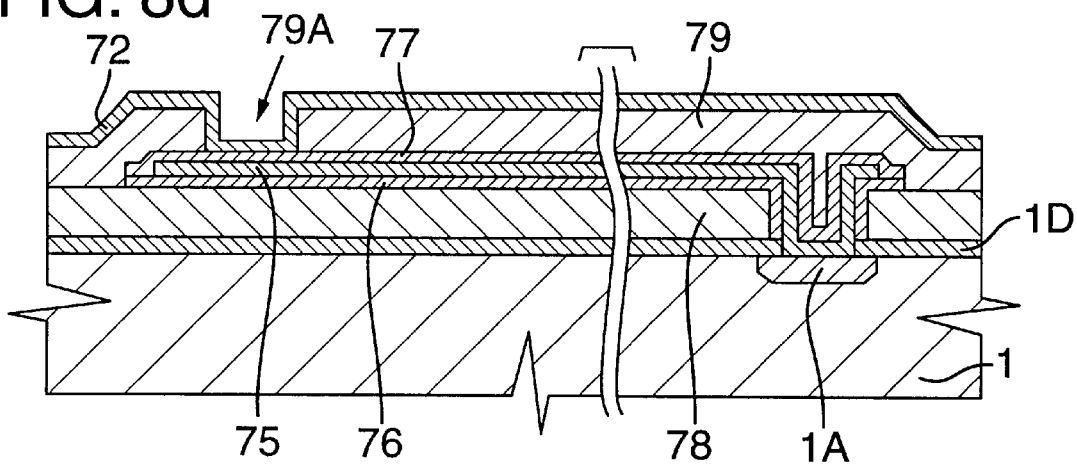
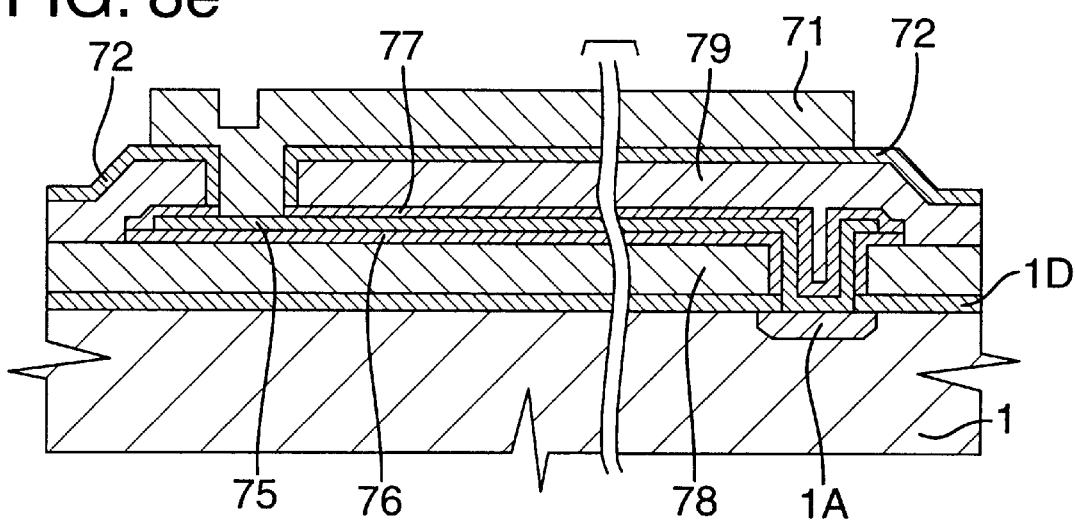

THERMAL INFRARED SENSORS, IMAGING DEVICES, AND MANUFACTURING METHODS FOR SUCH SENSORS

FIELD OF THE INVENTION

The invention pertains to thermal infrared sensors and imaging devices in which an absorber is supported above a substrate, forming a gap between the absorber and the substrate. The invention also pertains to manufacturing methods for such sensors and imaging devices comprising an array of such sensors.

BACKGROUND OF THE INVENTION

Conventional thermal infrared sensors have an infrared absorber, typically formed at a surface of a semiconductor substrate. The absorber absorbs an incoming infrared flux, converting the incident flux into heat. The temperature rise produced by this heat causes a thermally-induced change in a thermal sensing element such as a thermistor that is mounted on or in proximity to the absorber. The change is generally converted into an electrical signal and the signal is delivered to a readout circuit.

In such a sensor, temperature resolution can be increased by increasing the efficiency with which the incident flux is absorbed or increasing the response of the thermal sensing element to a fixed temperature change. For example, if the absorption of an infrared flux causes a change in a resistance value, a large change in resistance for a small absorbed power is desired.

With reference to FIGS. 18–19, a conventional thermal infrared sensor 100 has a micro-bridge structure that defines a space M between an infrared absorber 100A and a semiconductor substrate 101. The space M reduces heat conduction between the infrared absorber 100A and the semiconductor substrate 101, thereby increasing the response of the sensor. The infrared sensor 100 includes an infrared absorption layer and a thermoelectric layer formed on the infrared absorber 100A (these layers are not shown in FIGS. 18–19). The thermoelectric layer produces an electrical change in response to a temperature change. Two bridges 100B support the absorber 100A and suspend the absorber 100A above the substrate 101. The bridges 100B include electrical connections that connect the thermoelectric layer with a diffusion layer 101A that serves as a readout electrode. The micro-bridge structure lowers the thermal conductivity from the absorber 100A to the semiconductor substrate 101; such a sensor is preferable to an infrared sensor in which the absorber is in direct contact with a substrate. Therefore, the infrared sensor 100 has an increased response to infrared radiation.

Micro-bridge structures for infrared sensors have been developed in which the bridges 100B are longer and have smaller cross-sectional areas, reducing thermal conductivity further. Improvements in response can also be achieved by using materials with low heat capacities for the absorber 100A. Because only the absorber 100A absorbs the incident flux, the absorber 100A should occupy as large a proportion of the sensor surface area as possible. The proportion of the sensor surface area occupied by the absorber 100A is referred to as the "aperture ratio."

In addition, infrared imaging devices that have arrays of infrared sensors such as the sensor 100 have been developed. In these imaging devices, the proportion of the device surface area occupied by all the absorbers 100A (this proportion is also referred to as the "aperture ratio") must be large to achieve improved temperature resolution. Because the sensors 100 of an imaging device are separated by isolation bands that do not detect incident radiation, it is especially important that the absorption area of the sensors 100 be large.

In one prior-art imaging sensor, a readout circuit is situated directly below the absorber 100A in order to increase the aperture ratio. However, it is difficult to make an array of sensors having micro-bridges and maintain a large aperture ratio without simultaneously increasing sensor heat capacity.

If a fixed ratio between the heat capacity and the heat conductivity from the absorber 100A is maintained, changes in the aperture ratio do not effect sensor response. Consequently, a specified temperature resolution can be achieved by varying the size of the sensor. In this case, temperature resolution is not limited by sensor aperture ratio, but by practical limits in sensor fabrication. The bridges 100B are to be thin, narrow, and long to reduce heat conduction, and the absorber 100A surface area is to be as large as the bridges 100A can support. Therefore, fabrication of the bridges is difficult, especially for small sensors.

In a conventional sensor such as the sensor 100, the surface area of the sensor 100 must provide some area for the bridges 100B and contacts 100C. Thus, potential increases in aperture ratio are limited. It is even more difficult to achieve a large aperture ratio in an imaging device comprising an array of such sensors.

With reference to FIG. 19, the contacts 100C and the bridges 100B of the sensor 100 support the absorber 100A above the substrate 101. A cross-section of the contacts 100C is a V-shape, narrow where the contacts 100C attach to the substrate and wider where the contacts 100C connect to the bridges 100B. As a result, a large surface area is occupied by the contacts 100C. For example, a typical sensor 100 has a width of 40–50 $\mu$m and a space M having a height h of 2.5 $\mu$m. If the support that connects the contacts 100C to the substrate 101 has a diameter R1=1.0 $\mu$m, and if the contacts 100C have a 45° taper, then the diameter R for the contacts 100C must be about 6 $\mu$m. Because flux incident upon the contacts 100C and the bridges 100B produces very little heating, a large surface area occupied by the contacts 100C and the bridges 100B reduces the aperture ratio of the sensor 100, thereby degrading the responsivity of the sensor.

With reference to FIG. 19, a space L is defined between the bridges 100B and the absorber 100A. The space L thermally isolates the bridges 100B and the absorber 100A but reduces the aperture ratio. Imaging systems comprising an array of sensors such as the sensors 100 also have an isolation region 101B defined between adjacent sensors 100. The isolation regions 101B prevent transmission of heat on one sensor 100 to neighboring sensors, but also reduce the aperture ratio. Infrared imaging devices using conventional sensors have aperture ratios of less than about 50 percent, i.e. more than one-half of the area of the substrate 1 is unavailable for the absorption of the incident flux.

Thus, when the aperture ratio is low, a single thermal infrared sensor 100 must occupy a large area in order to improve the temperature resolution of the sensor. It is difficult to integrate such large sensors into an imaging device. If the number of sensors required for an imaging device is specified and the size of the substrate 1 is limited, then sensors having a small aperture ratio use only a small portion of the substrate area for absorption.

SUMMARY OF THE INVENTION

The invention provides thermal infrared sensors, imaging devices using the sensors, and methods for making the sensors. The sensors provided use a large proportion of sensor area for infrared absorption, i.e., these sensors have a large aperture ratio. The sensors have a simple structure that reduces heat conduction between the absorber and the substrate. In addition, an electrical connection is provided that connects the absorber to the substrate.

According to a preferred embodiment, a sensor according to one aspect of the invention comprises an absorber that has a front surface for receiving an incident infrared flux and a rear surface for attachment to a substrate, preferably a semiconductor substrate. The absorber has a thermal sensing element, such as a thermistor, and an infrared absorbing layer. The absorber is supported above the substrate by bridges and supports. Generally, a support attached to the substrate holds the bridge above the substrate; a second support attached to the bridge and the rear surface of the absorber holds the absorber above the bridge. Gaps are defined between the absorber and the bridge as well as the bridge and the substrate. The bridge is held approximately parallel to the surface of the substrate and the gaps between the absorber, bridge, and substrate are preferably similar. Alternatively, the bridge can be held at an angle with respect to the substrate so that the gaps progressively narrow in one dimension.

The bridge preferably provides an electrical connection from the thermal sensing element to a readout electrode on the substrate. The bridge comprises a conducting layer for this electrical connection; this same conducting layer can also be part of the supports. The bridge therefore electrically connects the thermal sensing element on the absorber to the substrate. The readout electrode is preferably a metal layer or a highly-doped region of the substrate.

The supports that connect the absorber and the bridge can be electrically connected to the absorber by highly doping the semiconductor material that forms the absorber. Alternatively, a metal layer, such as a tungsten layer, can be used.

According to a preferred embodiment, a sensor-manufacturing method according to another aspect of the invention comprises first steps of providing a substrate, preferably a semiconductor, and forming a readout electrode on the substrate. The readout electrode can be either a metal layer on the surface of the substrate or embedded in the substrate. Alternatively, the readout electrode can be a highly-doped region of the substrate.

In subsequent steps of the method, a first sacrificial layer of silicon oxide is then deposited on the substrate and a first aperture is etched through this layer, exposing a portion of the readout electrode. A silicon nitride layer is then deposited and the silicon nitride covering the bottom of the first aperture is removed. A first conductor layer is then deposited that electrically connects to the readout electrode. The first conductor layer contacts the readout electrode and either coats the sides of the first aperture or fills the first aperture. Another silicon nitride layer is then deposited, followed by deposition of a second sacrificial layer. A second aperture is then formed in the second sacrificial layer, exposing a portion of the first conductor layer. A second conductor layer is deposited in the second aperture and an absorber layer is formed on the second sacrificial layer. The absorber is preferably a layer of polysilicon; the polysilicon can be highly doped to provide an electrical connection of the absorber to the second conductor layer. The first and second sacrificial layers are then removed, preferably using a wet etching process.

The foregoing and other features and advantages of the invention will become more apparent from the following detailed description of example embodiments which proceeds with reference to the accompanying drawings.

BRIEF DESCRIPTION OF THE DRAWINGS

FIGS. 8(a)–8(g) are elevational sectional views of the thermal infrared sensor of FIG. 7 illustrating a preferred embodiment of a manufacturing process for making such a sensor.

DETAILED DESCRIPTION

Example Embodiment 1

Figure 1:
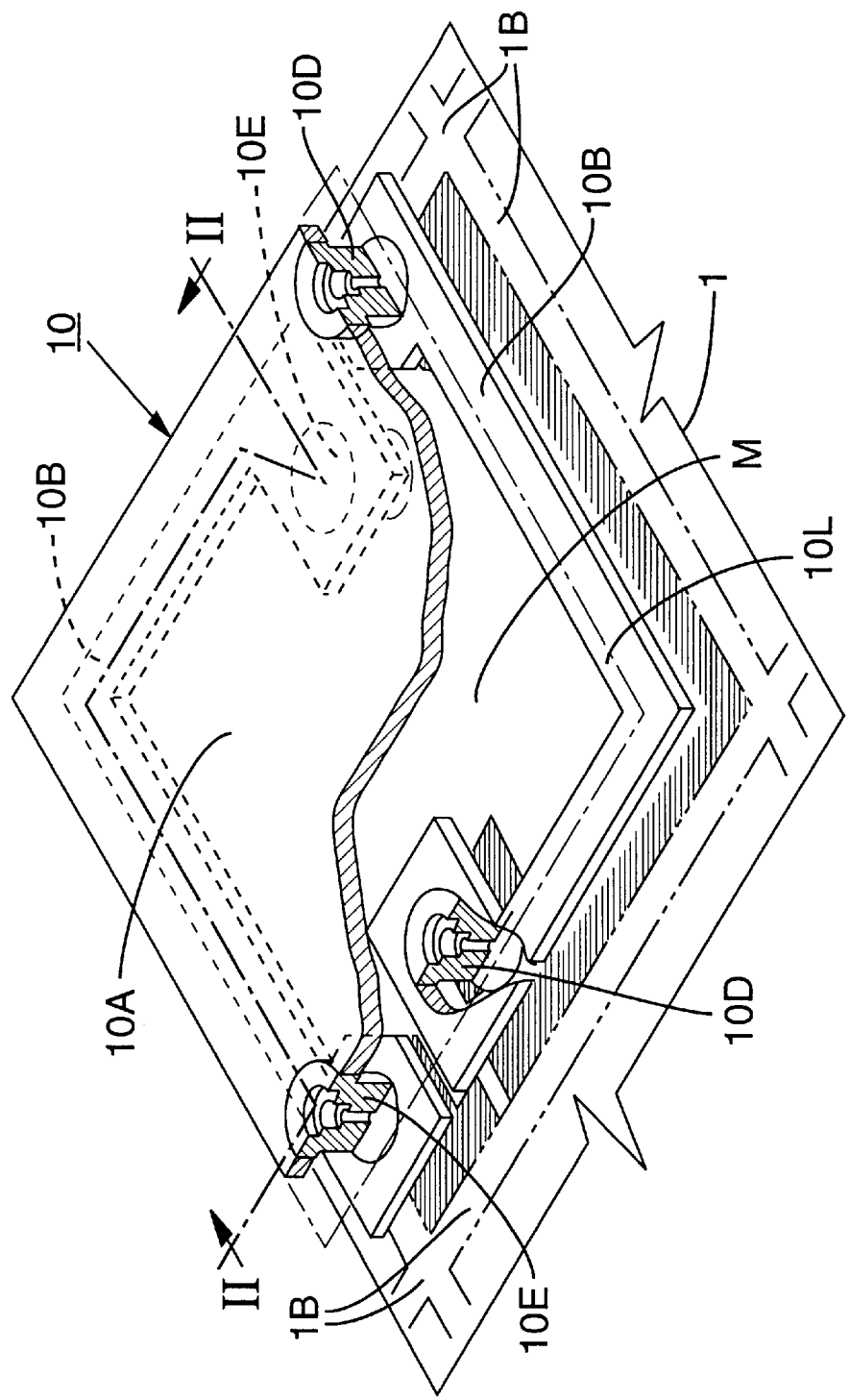
FIG. 1 is a perspective view (with partial cutaway) of a thermal infrared sensor according to Example Embodiment 1.

With reference to FIG. 1, a thermal imaging device according to Example Embodiment 1 comprises a two-dimensional array of thermal infrared sensors on a silicon substrate 1. For convenience, only an exemplary sensor 10 of the array is shown in FIG. 1. While the substrate 1 is preferably a silicon substrate, it will be apparent that other semiconductor substrates are suitable. The sensor 10 is separated from other sensors by isolation bands 1B extending parallel to the rows and columns of the array. The isolation bands 1B reduce heat transfer between individual sensors 10 and other sensors of the array.

Figure 2:
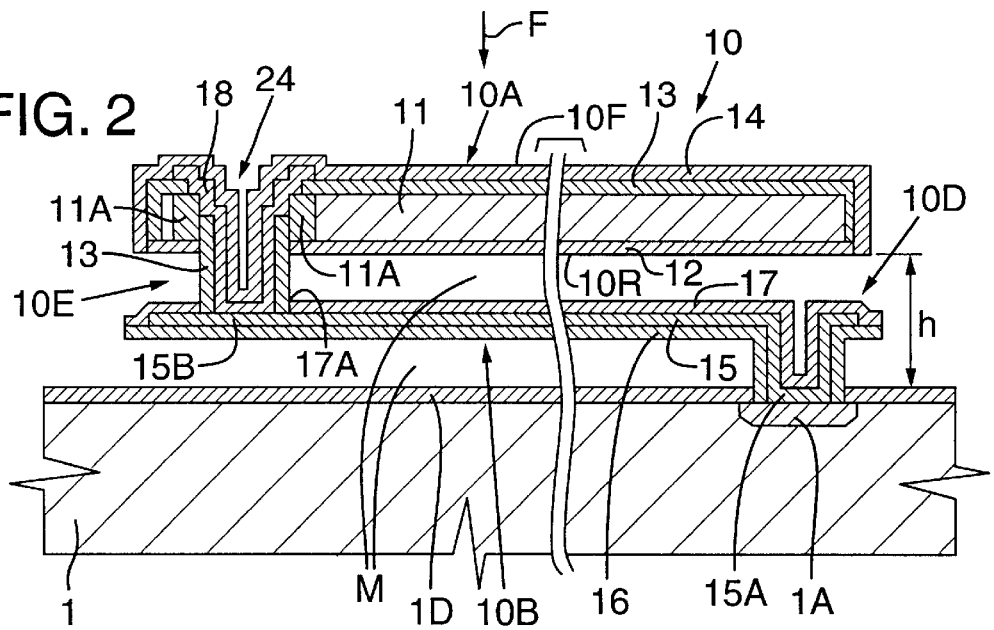
FIG. 2 is an elevational sectional view of the thermal infrared sensor of FIG. 1.

With reference to FIGS. 1–2, the sensor 10 comprises a p-n junction thermistor (not shown in FIGS. 1–2) on an absorber 10A. The absorber 10A has a front surface 10F for receiving an incident flux F and a rear surface 10R that faces toward the substrate 1. The absorber 10A is supported by a micro-bridge structure comprising bridges 10B and supports 10D, 10E. The supports 10D hold the bridges 10B above the substrate 1; the supports 10E hold the absorber 10A above the bridges 10B. The absorber 10A is thus supported a distance h above the substrate 1 and each bridge 10B is separated by a gap M from the substrate 1. In addition, the supports 10D electrically connect the bridges 10B to a readout electrode 1A that is formed by diffusing an impurity into the substrate 1.

As shown in FIG. 2, the bridges 10B have a titanium layer 15; the supports 10D, 10E also use the titanium layer 15 and have a conducting layer 18 of aluminum. The layers 15, 18 electrically connect the p-n thermistor or other heat-sensing element on the absorber 10A to the readout electrode 1A. The bridges 10B are preferably L-shaped sections of thin plates, positioned between the absorber 10A and the substrate 1 and approximately parallel to the absorber 10A. A side 10L of one of the bridges 10B is about 40 µm long; the thickness and width of the bridges 10B are preferably small but adequate to support the absorber 10A. Because the bridges 10B have long, narrow sections, heat conduction by the bridges 10B is reduced. As is apparent, such a bridge structure has a high thermal resistance.

The supports 10D, 10E are situated below the absorber 10A with respect to an incident infrared flux F. Because the supports 10D, 10E do not extend outside the area defined by the absorber 10A, the supports 10D, 10E are shielded from the incident infrared flux F and the entire area of the absorber 10A is available to receive the flux F.

As shown in FIG. 2, the absorber 10A has a polycrystalline silicon ("polysilicon") layer 11 and silicon nitride layers 12, 13, 14 that cover the polysilicon layer 11. Silicon nitride readily absorbs infrared radiation so that the silicon nitride layers 13, 14 also determine the effective surface area for absorption of the flux F by the absorber 10A. Alternatively, an additional infrared absorption layer can be provided.

An n-type diffusion region and a p-type diffusion region are provided in the polysilicon layer 11 and form the p-n junction thermistor mentioned above (not shown in FIGS. 1–2). A through-hole 24 is provided that is surrounded by a contact region 11A, formed by a highly-doped impurity diffusion portion of the polysilicon layer 11. The contact region 11A is electrically connected to the p-n junction thermistor. As shown in FIG. 2, the bridge 10B has the titanium layer 15 sandwiched between silicon nitride layers 16, 17. An end 15A of the titanium layer 15 is electrically connected to the readout electrode 1A on the substrate 1.

An aperture 17A is defined in the silicon nitride layer 17 that covers the titanium layer 15. An end 15B of the titanium layer 15 is electrically connected to the contact region 11A by the aluminum layer 18 at the aperture 17A. An end 15A of the titanium layer 15 serves both as a portion of the support 10D and as an electrical connection; the aluminum layer 18 serves both as a portion of the support 10E and as an electrical connection.

The aluminum layer 18 is formed on an inner wall of the through-hole 24 to connect to the contact region 11A. The aluminum layer 18 is sandwiched between the silicon nitride layers 13, 14. The silicon nitride layers 13, 14 protect the aluminum layer 18. In this way, the bridges 10B and the supports 10D, 10E form a support for the sensor 10 and electrically connect the absorber 10A to the readout electrode 1A.

Figure 3A:
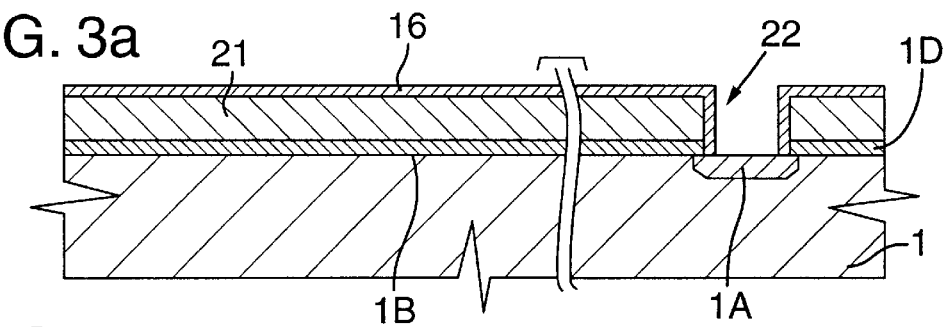
FIGS. 3(a)–3(h) are elevational sectional views of the thermal infrared sensor of FIG. 1 illustrating a preferred embodiment of a manufacturing process for making such a sensor.

A manufacturing method for the sensor 10 of Example Embodiment 1 comprises the following steps. With reference to FIG. 3(a), the readout electrode 1A is formed on a surface 1B of the substrate 1 by diffusing an impurity into the substrate 1. The surface 1B of the substrate 1 is covered with a silicon nitride layer 1D. A 1.0-µm thick silicon oxide layer 21 is deposited on the silicon nitride layer 1D using chemical vapor deposition ("CVD"). The silicon oxide layer 21 is a first sacrificial layer and is removed by etching in a subsequent process step.

A contact hole 22 is formed in the silicon nitride layer 1D and the silicon oxide layer 21 using photolithographic patterning ("photo-patterning") and dry-etching, exposing the readout electrode 1A. The dry-etching of the silicon nitride film 1D and the silicon oxide film 21 can be performed using a high-frequency gas plasma with a mixed gas flow of 32 standard cubic centimeters per minute ("sccm") of $CHF_3$, 16 sccm of $CF_4$, and 98 sccm of He at a gas pressure of 0.5 Torr with a radio frequency ("RF") drive power of 200 W.

The silicon oxide layer 21 is covered with the 0.2-µm thick CVD-deposited silicon nitride layer 16. The silicon nitride layer 16 is photo-patterned and dry-etched to remove silicon nitride from the bottom of the contact hole 22. Etching of the silicon nitride layer 16 is preferably performed in an $CF_4$ atmosphere at a pressure of 0.4 Torr with an RF power of 200 W. After this etching process is complete, the sensor 10 is structured as shown in FIG. 3(a).

Figure 3B:
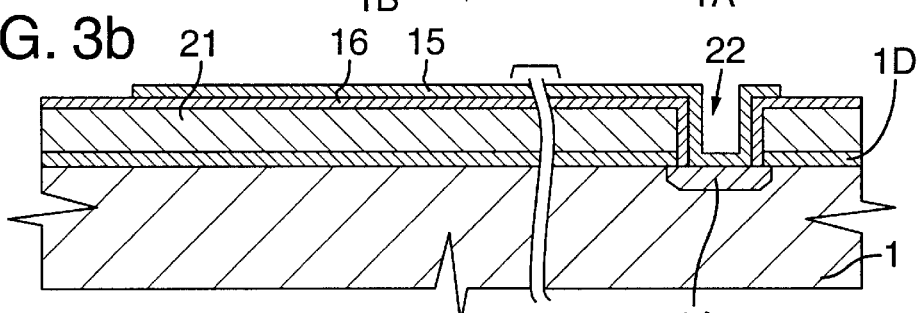

With reference to FIG. 3(b), a 0.2-µm titanium layer 15 is sputtered over the contact hole 22 and the silicon nitride layer 16. The titanium layer 15 provides an electrical connection for the supports 10D and the bridges 10B to the readout electrode 1A. Titanium is preferably used because of its relatively low thermal conductivity, which reduces heat flow between the absorber 10A and the substrate 1. The titanium layer 15 is photo-patterned and dry-etched. The titanium layer 15 is etched in a flowing gas comprising, for example, 25 sccm of $CHCl_3$, 20 sccm of $Cl_2$, 40 sccm of $BCl_3$, and 120 sccm of $N_2$ at a pressure of 0.3 Torr; the RF drive power is 180 W. After these steps are complete, the sensor 10 is structured as shown in FIG. 3(b).

Figure 3C:
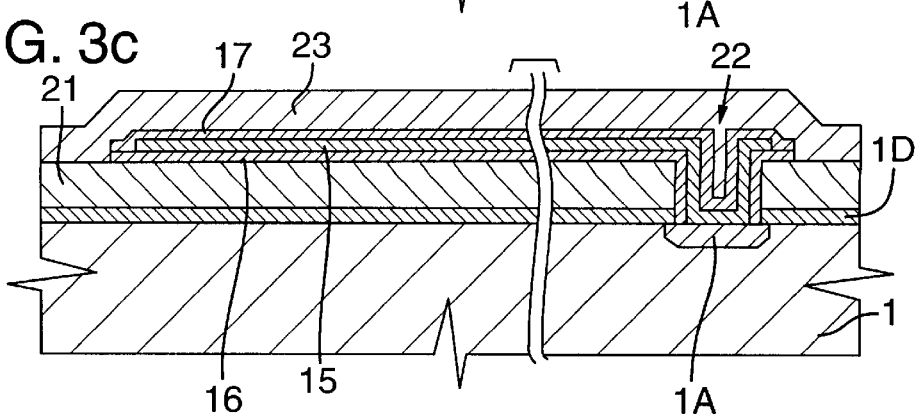

With reference to FIG. 3(c), the titanium layer 15 is then covered with a 0.2-µm thick CVD-deposited silicon nitride layer 17. The silicon nitride layer 17 is photo-patterned and dry-etched. The silicon nitride layer 17 completely covers the titanium layer 15 and serves as a protective layer. Next, a 1.0-µm thick CVD-deposited silicon oxide layer 23 is deposited. The silicon oxide layer 23 is a second sacrificial layer. After the silicon oxide layer 23 is deposited, the sensor 10 is structured as shown in FIG. 3(c).

Figure 3D:
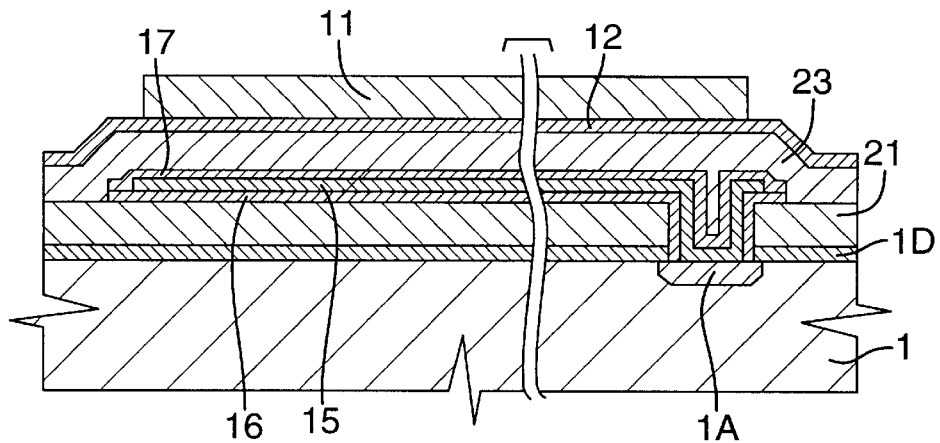
Figure 3E:
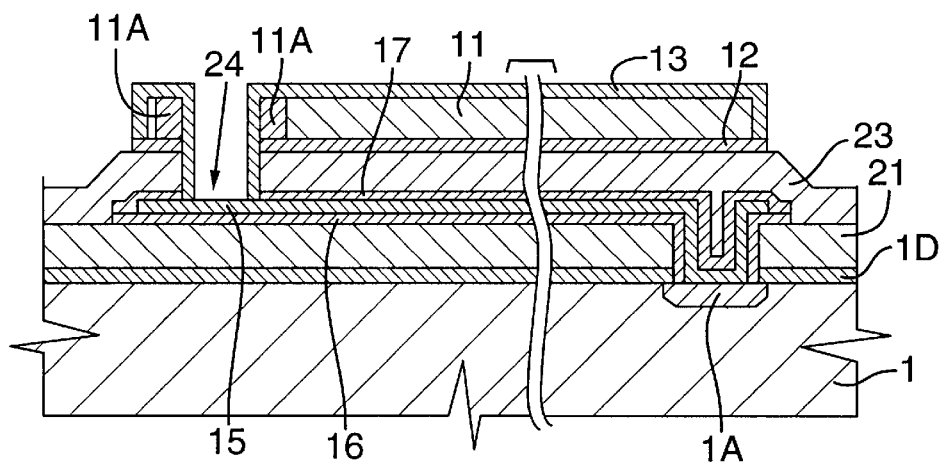
Figure 3F:
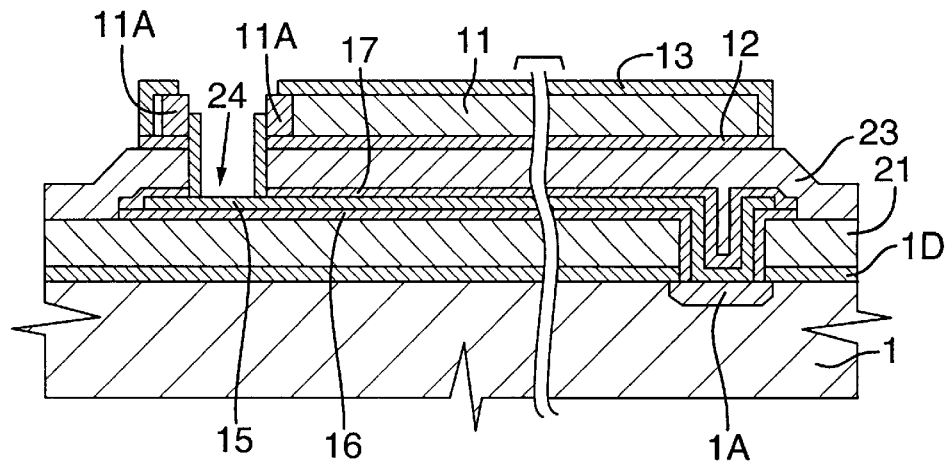
Figure 3G:
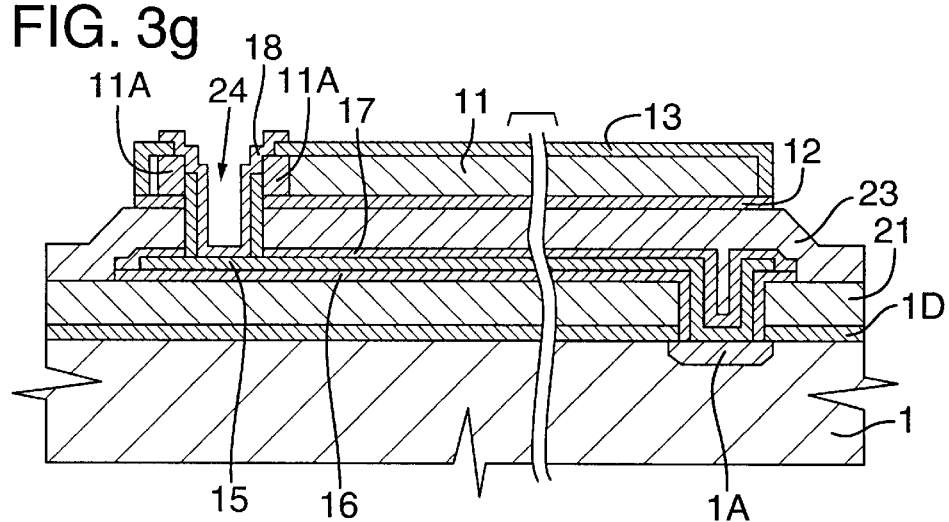
Figure 3H:
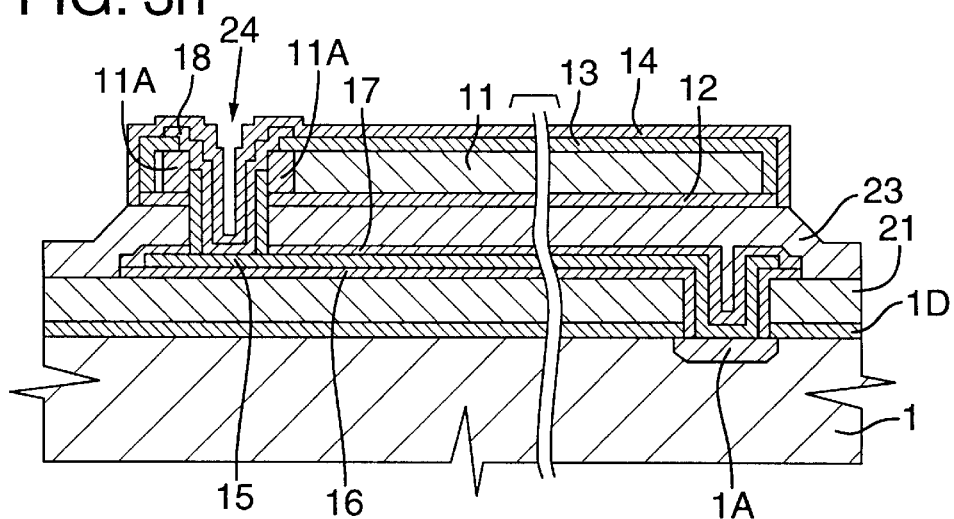

With reference to FIG. 3(d), the silicon oxide layer 23 is covered with a 0.2-µm thick CVD-deposited silicon nitride layer 12, completely covering the silicon oxide layer 23. The silicon nitride layer 12 is covered with a 0.5- to 1.0-µm thick polysilicon layer 11 using, for example, a plasma CVD method or a low-pressure chemical-vapor deposition ("LPCVD") method. If plasma CVD is used, the deposition is preferably performed with a gas flow consisting of 300 sccm of $SiH_4$ and 7 standard liters per minute ("slm") of Ar at a temperature of 300 C and a pressure of 1.2 Torr and an RF drive power of 3 kW at a frequency of 430 kHz.

The polysilicon layer 11 is photo-patterned and dry-etched, defining the size of the absorber 10A. The etching of the polysilicon layer 11 is performed in a gas flow of, for example, 40 sccm of $SF_6$ and 20 sccm of $CHClF_2$ at a pressure of 0.18 Torr and an RF power of 75 W. After this step is complete, the sensor 10 is structured as shown in FIG. 3(*d*).

With reference to FIG. 3(*e*), the polysilicon layer 11 is covered with a thin (about 0.1 μm thick) CVD-deposited silicon nitride layer (not shown in FIG. 3). The polysilicon layer 11 is photo-patterned and p- and n-type impurities are ion-implanted in the polysilicon layer 11. The layer 11 is annealed in a nitrogen atmosphere at a temperature of 600 C for 60 minutes, activating the implanted impurities and forming a p-n junction for the thermistor (not shown in FIG. 3(*e*)), as well as a contact region 11A.

A through-hole 24 near the center of the contact region 11A is formed using photo-patterning and dry-etching to expose the titanium layer 15. A 0.2-μm thick CVD silicon nitride layer 13 is deposited, covering the polysilicon layer 11. The silicon nitride layer 13 is photo-patterned and dry-etched. After this step, the sensor 10 is structured as shown in FIG. 3(*e*).

With reference to FIG. 3(*f*), the silicon nitride layer 13 is etched, exposing the contact region 11A in the through-hole 24. After this step, the sensor 10 is structured as shown in FIG. 3(*f*).

With reference to FIG. 3(*g*), a 0.3-μm thick aluminum layer 18 is applied by sputtering to electrically connect to the contact region 11A. The aluminum layer 18 is patterned so that the sensor 10 has a structure as shown in FIG. 3(*g*).

With reference to FIG. 3(*h*), a 0.1-μm thick silicon nitride layer 14 is deposited, photo-patterned, and dry-etched. The silicon nitride layer 14 covers the silicon nitride layer 13 that, in turn, covers the polysilicon layer 11. The silicon nitride layer 14 also covers the aluminum layer 18 in the through-hole 24. After this step, the sensor 10 has a structure as shown in FIG. 3(*h*).

Finally the silicon oxide layers 21, 23 are removed by wet etching using a solution of HF and $NH_4F$ mixed in proportions of $HF:NH_4F$ of 1:10. This wet etching results in the completed sensor 10 shown in FIGS. 1–2.

Figure 18:
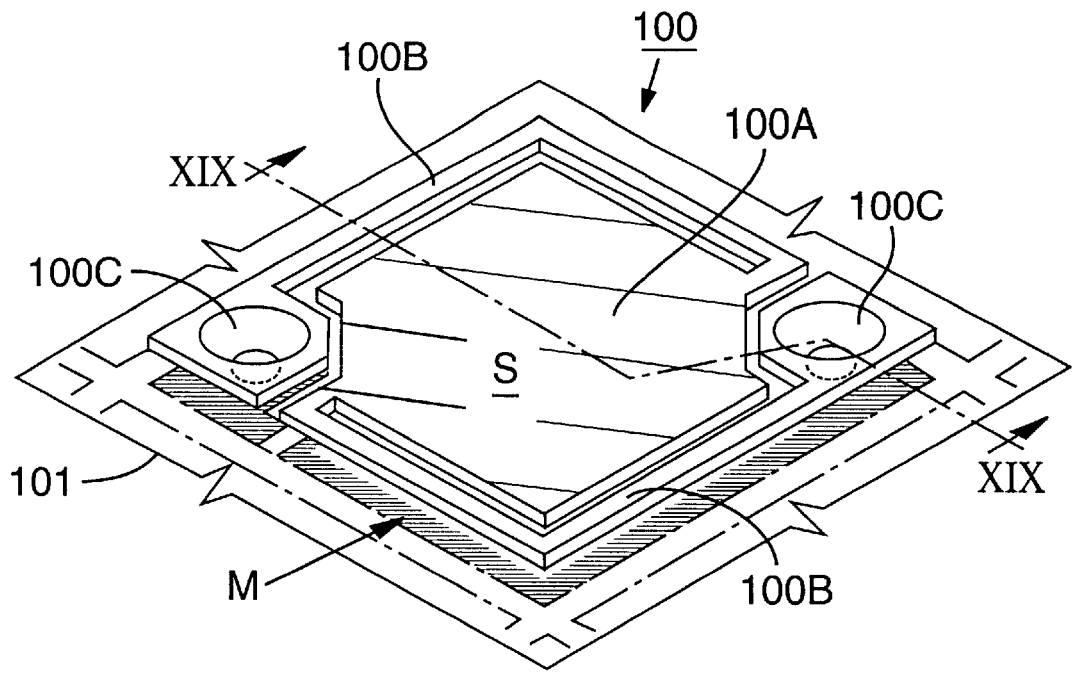
FIG. 18 is a perspective view of a conventional thermal infrared sensor.
Figure 19:
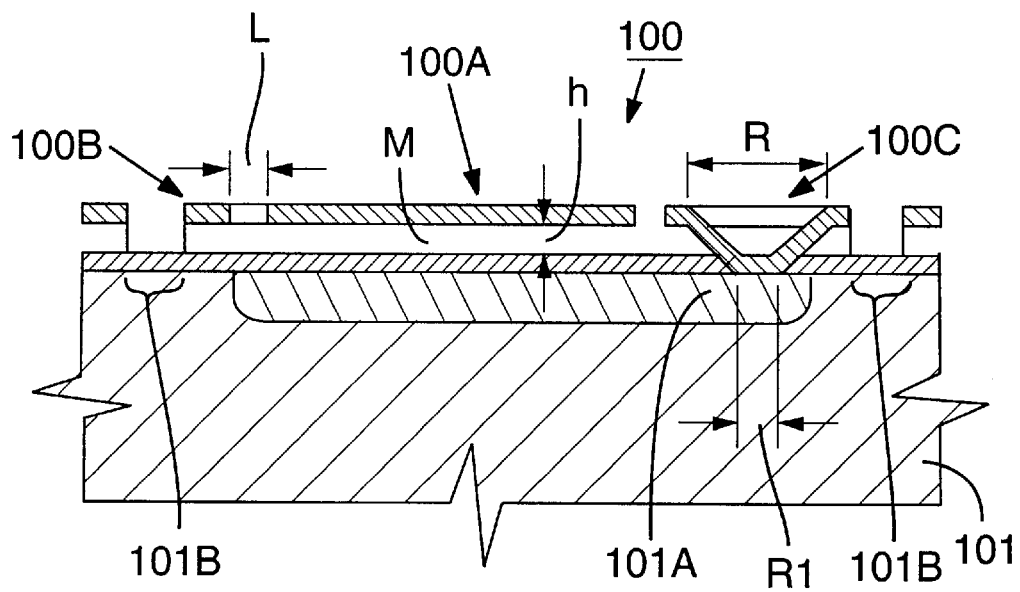
FIG. 19 is an elevational sectional view of the conventional thermal infrared sensor of FIG. 18.

In the sensor 10, a separate infrared-absorbing layer is not provided on the absorber 10A. The silicon nitride films 13, 14 serve as infrared absorbers as well as protective layers. The area covered by the silicon nitride layers 13, 14 thus serves as the infrared absorption area and the aperture ratio of this sensor is readily determined. As shown in FIGS. 1–2, the bridges 10B and the supports 10D, 10E are situated beneath the infrared absorption layer (not shown) of the absorber 10A, and thus allow the imaging device of Example Embodiment 1 to have an aperture ratio about 80% larger than the conventional imaging device 100 shown in FIG. 18.

Figure 4:
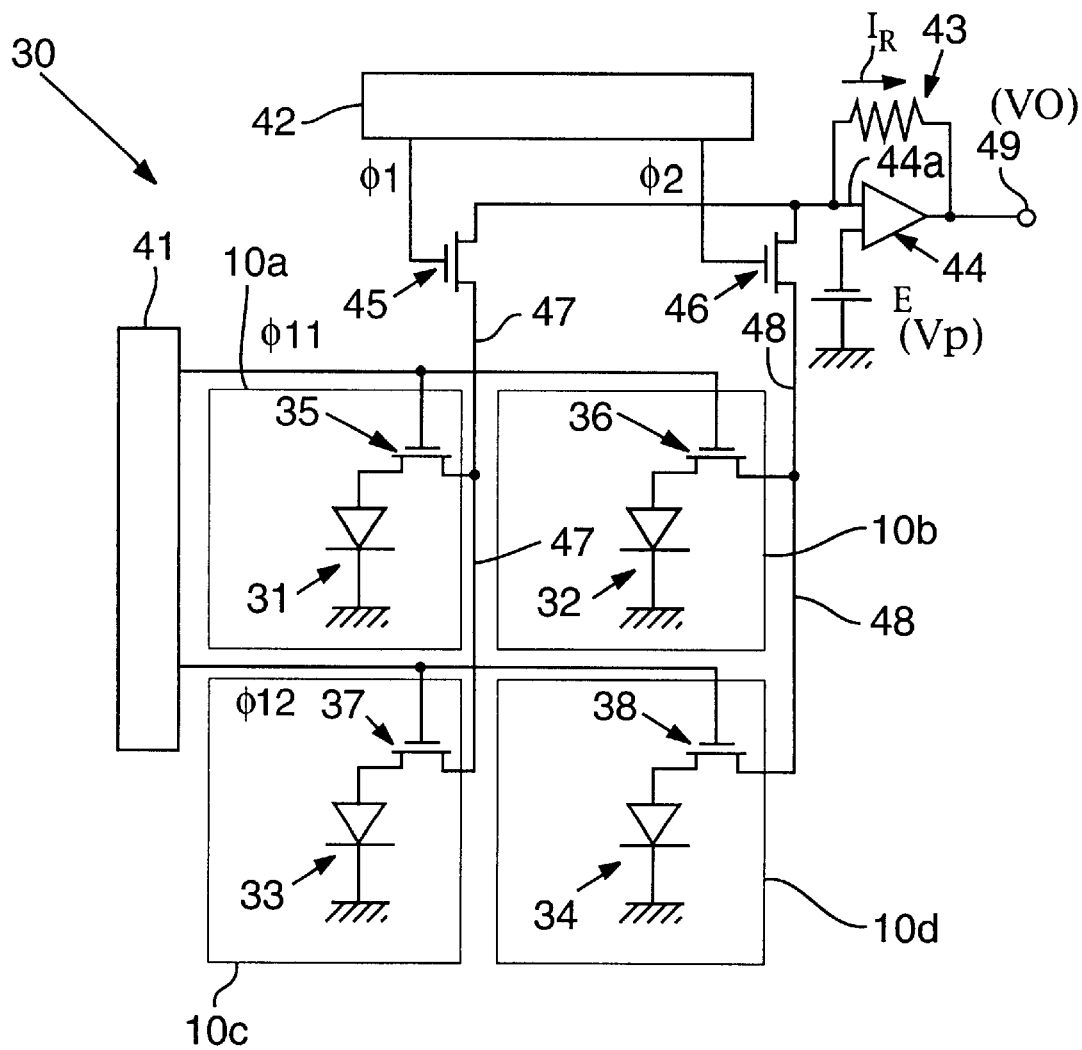
FIG. 4 is an electrical schematic diagram of a readout system for an array of thermal infrared sensors according to the invention.

Electrical readout of a thermal imaging device 30 according to the invention is described with reference to FIG. 4. The imaging device 30 comprises a two-dimensional array of infrared image sensors 10*a*–10*d*, arranged in two rows and two columns. The sensors 10*a*–10*d* deliver electrical signals corresponding to respective picture elements ("pixels") in an image obtained from the imaging device 30. For convenience, FIG. 4 shows only a two-row-by-two-column array of sensors 10*a*–10*d*. It will be apparent that the array can be larger and that the sensors can be arranged in a single row or column or in any of various other arrangements.

The sensor 10*a* has a p-n junction diode 31 formed on a polysilicon layer, such as the polysilicon layer 11 of FIG. 2. The diode 31 is thermally isolated from the semiconductor substrate 1 by the micro-bridge structure shown in FIGS. 1–2. The sensor 10*a* also has a readout p-type MOS transistor ("vertical switch") 35; the drain of the vertical switch 35 is connected to the diode 31. The gate of the vertical switch 35 is connected to a vertical scanning circuit 41 and the source of the vertical switch 35 is connected to a vertical readout line 47.

The remaining exemplary sensors 10*b*–10*d* are similarly arranged. The sensors 10*b*, 10*c*, 10*d* have diodes 32, 33, 34, respectively, that are connected to the drains of respective vertical switches 36, 37, 38. The gates of the vertical switches 36, 37, 38 are connected to the vertical scanning circuit 41 and the sources of the vertical switches 36, 37, 38 are connected to vertical readout lines 48, 47, 48, respectively.

The drain of a horizontal output p-type MOS transistor ("horizontal switch") 45 is connected to the vertical readout line 47. The gate of the horizontal switch 45 is connected to a horizontal scanning circuit 42 and the source of the horizontal switch 45 is connected to an input 44*a* of an op-amp 44.

The drain of the horizontal switch 46 is connected to the vertical readout line 48. The gate of the horizontal switch 46 is connected to the horizontal scanning circuit 42 and the source of horizontal switch 46 is connected to the input 44*a*. A feedback resistor 43 connects an output 49 of the op-amp 44 to the input 44*a*. A power supply E is connected to an input 44*b* of the op-amp 44.

Clock pulses and start pulses are supplied to the horizontal scanning circuit 42 and the vertical scanning circuit 41. The scanning circuits 41, 42 comprise shift registers. The horizontal scanning circuit 42 generates drive pulses $\Phi_1, \Phi_2$ that are output to the horizontal switches 45, 46, respectively. The vertical scan circuit 41 generates a drive pulse $\Phi_{11}$ that is output to the vertical switches 35, 36 and a drive pulse $\Phi_{12}$ that is output to the vertical switches 37, 38.

The drive pulses $\Phi_1, \Phi_2$ control the timing with which the horizontal switches 45, 46 are turned on and off. The drive pulses $\Phi_{11}, \Phi_{12}$ output by the vertical scanning circuit 41 are supplied to the gates of the vertical switches 35, 36 and 37, 38, respectively, to control the turn-on and turn-off of the vertical switches 35, 36 and the vertical switches 37, 38, respectively. By controlling the on/off timing of the horizontal switches 45, 46 and the vertical switches 35, 36, 37, 38, the sensors 10*a*–10*d* are read out and an electrical image signal is produced at the output 49.

An output voltage $V_O$ appears at the output 49 of the op-amp 44 and the power supply E provides a voltage $V_P$ at the input terminal 44*b*. If a current $I_R$ corresponding to an intensity of an incident infrared flux flows into the feedback resistor 43 from a selected one of the diodes 31–34, then the resulting voltage across the feedback resistor 43 is $V_O-V_P$, where $V_P=RI_R$. The voltage $V_O$ thus depends on the current $I_R$ in the diode 31 and the voltage $V_O$ is an electrical signal corresponding to an image formed by the imaging device 30.

As the vertical switches 35, 36, 37, 38, and the horizontal switches 45, 46 are turned on and off by the signals $\Phi_{11}, \Phi_{12}$, Φ₁, Φ₂ from the vertical scanning circuit 41 and the horizontal scanning circuit 42, currents corresponding to the sensors 10a–10d flow in the resistor 43 and the voltage $V_0$ corresponds to the sensors 10a–10d as readout.

Because the imaging device 30 comprises a plurality of sensors 10 with absorbers 10A supported by the bridges 10B and supports 10D, 10E below the absorber 10A, the surface area of the absorber 10A can be increased, thereby increasing the aperture ratio. Because the aperture ratio is larger, the surface area used for each sensor 10 can be reduced while permitting an equivalent infrared flux to be absorbed. Thus, it is possible to integrate large numbers of sensors 10 in the imaging device 30. Alternatively, the surface area of the sensors 10 can be increased, improving the temperature resolution of the imaging device 30.

Example Embodiment 2

Figure 5:
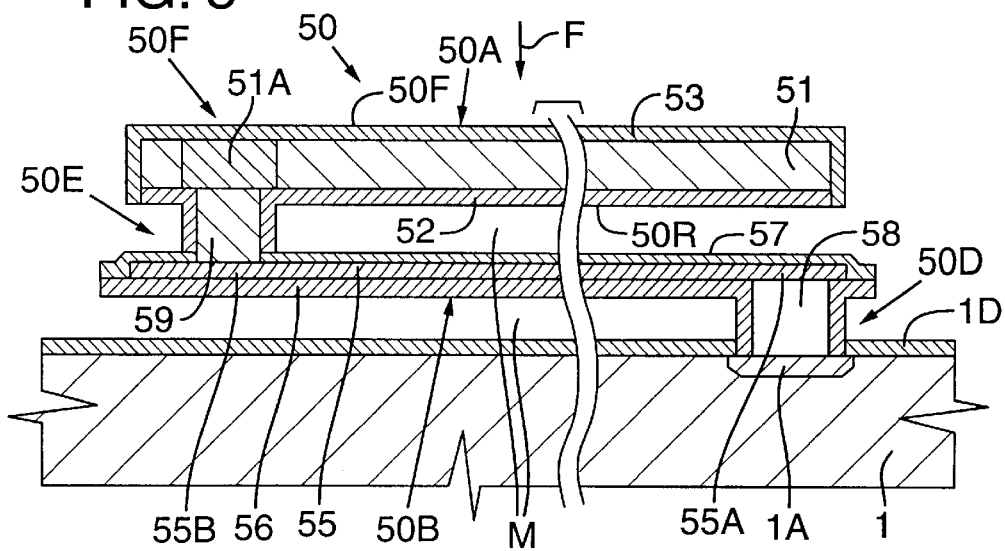
FIG. 5 is an elevational sectional view of a thermal infrared sensor according to Example Embodiment 2.

With reference to FIG. 5, a thermal imaging device according to Example Embodiment 2 comprises a two-dimensional array of thermal infrared sensors such as exemplary sensor 50, formed on a silicon substrate 1. The sensors of the array are separated by isolation bands (not shown in FIG. 5) from the other sensors of the array. While the imaging device of Example Embodiment 2 is similar to that of Example Embodiment 1, the sensor 50 differs from the sensor 10 in that the sensor 50 has supports 50D, 50E that are formed of a tungsten layer (or other metal layer). Otherwise, the sensor 50 is generally similar to the sensor 10 except as explained below.

With reference to FIG. 5, the sensor 50 comprises an absorber 50A, two bridges 50B (only one of which is shown in FIG. 5), and supports 50D, 50E. A p-n junction thermistor (not shown in FIG. 5) is formed on the absorber 50A. The absorber 50A has a front surface 50F that receives an incident infrared flux F and converts the flux F into heat; the heat is detected by the p-n junction thermistor. It will be apparent that other temperature-sensitive devices can be provided on the absorber 50A. In addition, the absorber 50A has a rear surface 50R that faces the substrate 1.

The bridges 50B and the supports 50D, 50E hold the absorber 50A above the substrate 1, forming respective gaps M. The bridges 50B and the supports 50D, 50E are situated beneath the absorber 50A with respect to the incident infrared flux F and are thus completely covered by the absorber 50A.

Each of the bridges 50B comprises a conducting layer 55 of titanium, and the supports 50D, 50E comprise metal layers 58, 59, preferably tungsten. Thus, a contact region 51A on the absorber 50A electrically connects to an impurity diffusion layer that forms a readout electrode 1A on the semiconductor substrate 1. The contact region 51A is preferably a highly-doped impurity diffusion region. The bridges 50B are similar to the bridges 10B of Example Embodiment 1, i.e., the bridges 50B are thin, L-shaped members that are parallel to the absorber 50A. The absorber 50A has a polysilicon layer 51 covered by silicon nitride layers 52, 53. Because silicon nitride absorbs infrared radiation, the silicon nitride layer 53 defines the effective area for infrared absorption. It will be apparent that a separate absorption layer can be provided on the absorber 50A.

A connector 50F comprises the contact region 51A that is electrically connected to the p-n junction thermistor (not shown in FIG. 5) on the absorber 50A. As shown in FIG. 5, silicon nitride layers 56, 57 cover the titanium layer 55 on the bridges 50B. A first end 55A of the titanium layer 55 is electrically connected to the tungsten layer 58 while a second end 55B is electrically connected to the tungsten layer 59. The titanium layer 55 is also electrically connected to the readout electrode 1A via the tungsten layer 58 and to the layer 51A via the tungsten layer 59. Therefore, the tungsten layer 58 is a part of the support 50D and an electrical connection; the tungsten layer 59 is a part of the support 50E and an electrical connection. Exterior surfaces of the layers 58, 59 are covered by the silicon nitride layers 56, 52 which serve as protective layers.

Figure 6A:
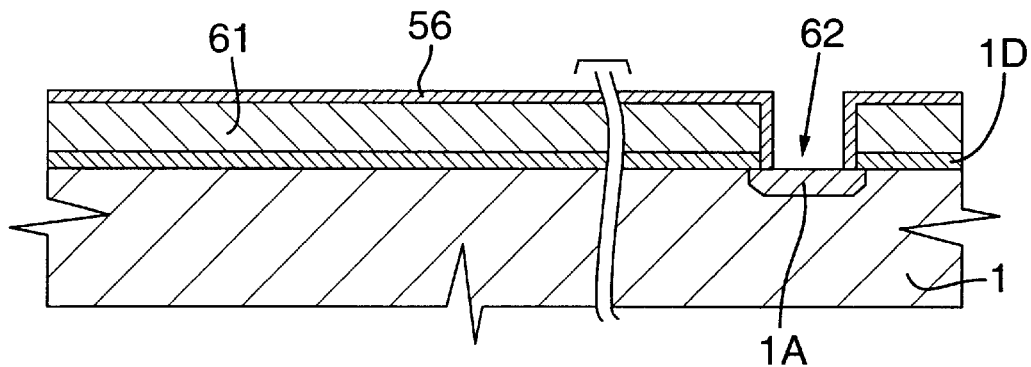
FIGS. 6(a)–6(f) are elevational sectional views of the thermal infrared sensor of FIG. 5 illustrating a preferred embodiment of a manufacturing process for making such a sensor.

A manufacturing method for the sensor 50 is described with reference to FIGS. 6(a)–6(f). First, the surface of the substrate 1 is covered with a silicon nitride layer 1D and a 1.0-μm thick silicon oxide layer 61. The layer 61 is the first sacrificial layer. Next, a contact hole 62 is formed by photo-patterning and dry etching the layers 1D, 61, exposing the readout electrode 1A. The substrate 1 is then covered with a 0.2-μm thick silicon nitride layer 56. The silicon nitride layer 56 is patterned and etched, exposing the readout electrode 1A. The manufacturing conditions are the same as those of Example Embodiment 1 and detailed discussion is omitted. After the steps above are complete, the sensor 50 is structured as shown in FIG. 6(a).

Figure 6B:
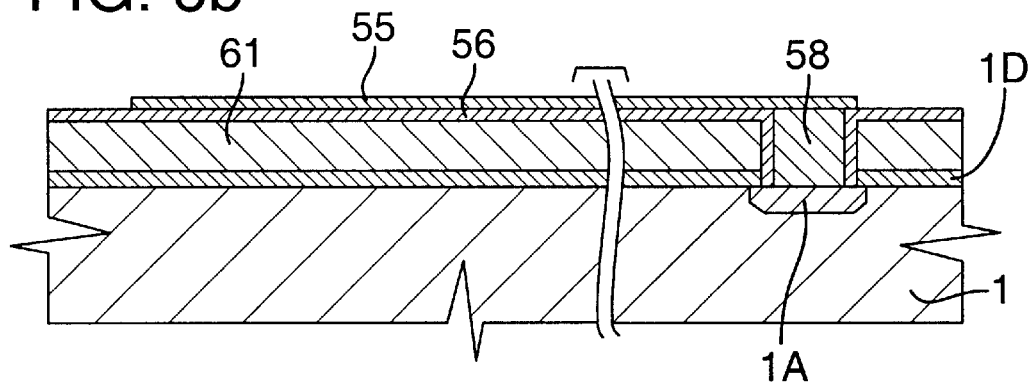

With reference to FIG. 6(b), the tungsten layer 58 is deposited using CVD or another suitable process. The titanium layer 55 (about 0.2 μm thick) is sputtered onto the layer 58. The titanium layer 55 is patterned and etched. The tungsten layer 58 provides an electrical connection for the support 50D, while the titanium layer 55 provides an electrical connection for the bridges 50B. The tungsten layer 58 can be deposited by CVD in an unheated chamber with a flowing gas comprising 10 sccm of $WF_6$, 100 sccm of $H_2$, and 100 sccm of Ar at a pressure of 0.13 Torr. During deposition, the substrate 1 is held at a temperature of 180 C. At this stage, the sensor 50 has a structure as shown in FIG. 6(b).

Figure 6C:
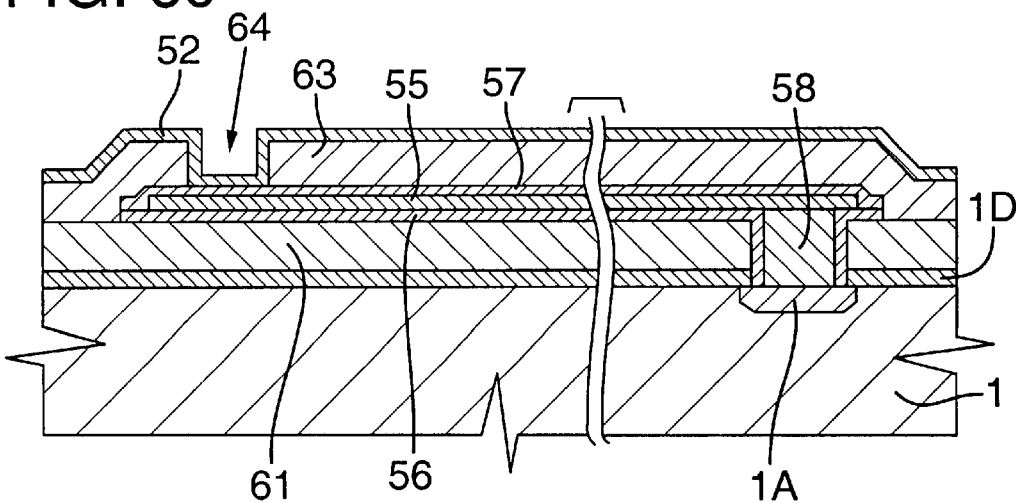

The 0.2 μm silicon nitride layer 57 is CVD-deposited, patterned, and etched to cover the titanium layer 55. The silicon nitride layer 57 also functions as a protective layer. The silicon oxide layer 63 is then CVD-deposited to a thickness of 1.0 μm. The silicon oxide layer 63 is a second sacrificial layer. A through-hole 64 is then formed in the silicon oxide layer 63 and a 1.0-μm thick silicon nitride layer 52 is CVD-deposited. The sensor 50 at this stage has a structure as shown in FIG. 6(c).

Figure 6D:
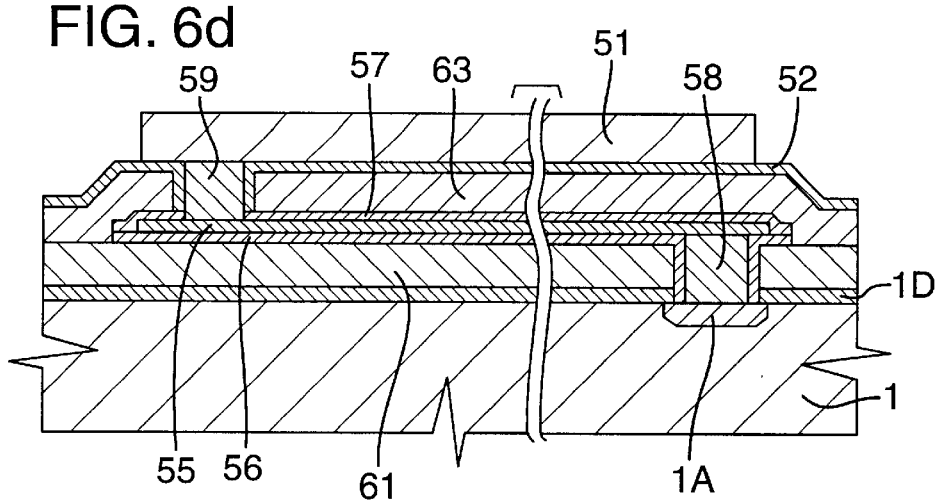

The bottom of the through-hole 64 is etched, removing portions of the layers 52, 57 and exposing the titanium layer 55. This is preferably done by photo-patterning and etching. The tungsten layer 59 is CVD-deposited and covered with the polysilicon layer 51 that is plasma CVD or LPCVD deposited. The polysilicon layer 51 is preferably between 0.5 μm and 1.0 μm thick. The polysilicon layer 51 is patterned and etched to the size of the absorber 50A. The tungsten layer 59 is part of the support 50E. The CVD-deposition of the tungsten layer 59 can be performed under the same conditions as used to form the tungsten layer 58, as described above. The etching of the polysilicon layer 51 can be carried out in a gas flow of 40 sccm of $SF_6$ and 20 sccm of $CHClF_2$, at a gas pressure of 0.18 Torr and an RF drive power of 75 W. At this stage, the sensor 50 has a structure as shown in FIG. 6(d).

Figure 6E:
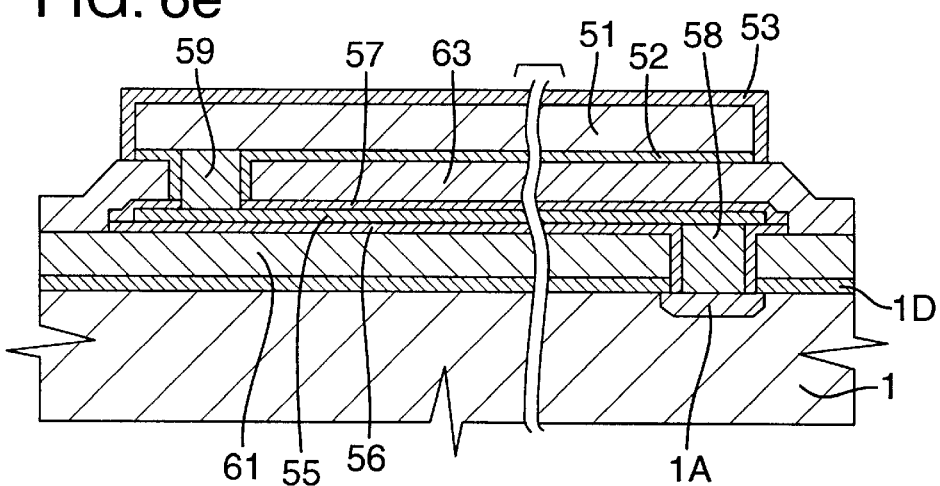

A 0.1-μm thick silicon nitride layer 53 is deposited, covering the polysilicon layer 51. The silicon nitride layers 52, 53 are patterned and etched so that the silicon nitride layer 53 completely covers the polysilicon layer 51. The sensor 50 at this stage has a structure as shown in FIG. 6(e).

Next, the contact region 51A is made by photo-patterning and ion-implantation of p- and n-type impurities in the polysilicon layer 51. The p-n junction thermistor (not shown) is made by the same processes. The p-implanted region of the layer 51A is electrically connected to the p-implanted region of the p-n junction; the n-implanted region of the layer 51A is electrically connected to the n-implanted region of the p-n junction.

Figure 6F:
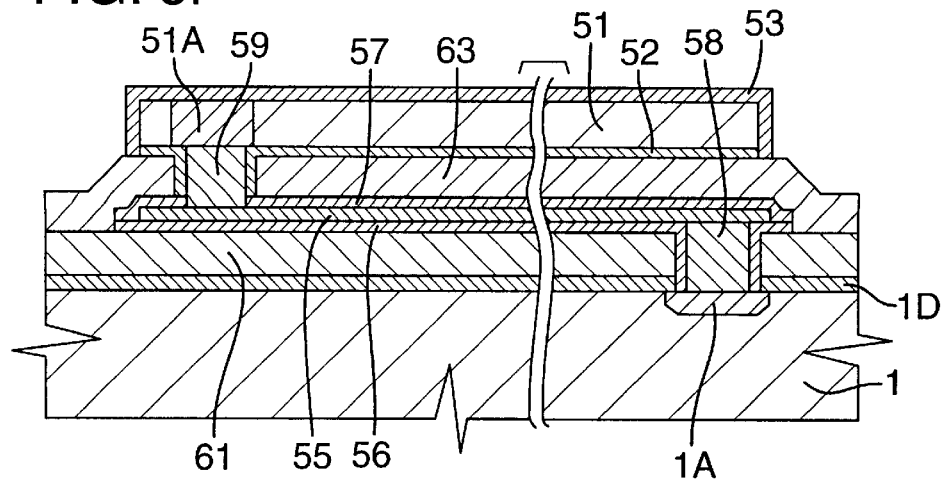

The connector 50F electrically connects to the tungsten layer 59. As a result, the contact region 51A is electrically connected to the p-n junction on the polysilicon layer 51. The contact region 51A is made by ion implantation with, for example, a dose of $5 \times 10^{15}$ cm$^{-2}$ and an ion-acceleration voltage of 150 kV. These ion-implantation conditions produce a sufficiently high doping density in the contact region 51A even down to where the contact region 51A contacts the tungsten layer 59. The sensor is annealed in a nitrogen atmosphere at 1000 C for 60 minutes. The p-type diffusion layer and the n-type diffusion layer that form the p-n junction are ion-implanted with, for example, a dose of between about $5 \times 10^{14}$ cm$^{-2}$ and $1 \times 10^{15}$ cm$^{-2}$ at an acceleration voltage of 150 kV. Annealing is performed in a nitrogen atmosphere at 600 C for 60 minutes. The sensor 50 at this stage has a structure as shown in FIG. 6(f).

Finally, the silicon oxide layers 61, 63 are removed by wet etching with a hydrofluoric acid solution, yielding the micro-bridge structure thermal infrared sensor 50 shown in FIG. 5.

The infrared absorption layer on the absorber 50A can comprise the silicon nitride layer 53 or another layer. In either case the entire area of the absorber 50A is an infrared absorber. Moreover, as shown in FIG. 5, the bridges 50B are located beneath the absorber 50A and do not block the incident infrared flux F. Thus, the useful absorption area is larger than that of a conventional sensor and the aperture ratio is increased by about 80%. In addition, in Example Embodiment 2, the tungsten layers 58, 59 fill the contact hole 62 and the through-hole 64; thus, a through-hole, such as the through-hole 24 of Example Embodiment 1, is not needed.

Multiple sensors such as the sensor 50 can be used to make an imaging device. Situating the supports 50D, 50E and the bridges 50B supporting the absorber 50A beneath the absorber 50A increases the substrate area available and permits a large aperture ratio. Because the aperture ratio is larger than with conventional imaging devices, the surface area occupied by individual sensors can be reduced while maintaining temperature resolution. Therefore, more individual sensors can be integrated into an imaging device. It is also possible to expand the surface area occupied by individual sensors and thereby obtain increased temperature resolution.

Example Embodiment 3

Figure 7:
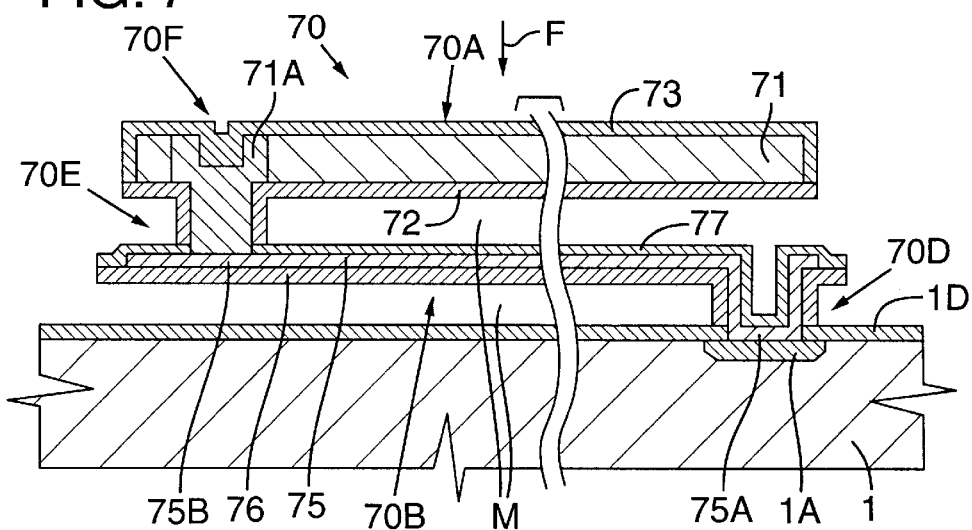
FIG. 7 is an elevational sectional view of a thermal infrared sensor according to Example Embodiment 3.

With reference to FIG. 7, a thermal infrared sensor 70 is formed on a silicon substrate 1. It will be apparent that an imaging device comprises an array of multiple sensors such as the sensor 70. The sensor 70 differs from the sensor 10 of Example Embodiment 1 in that the sensor 70 comprises a support unit 70E having a contact region 71A formed in the polysilicon layer 71. Generally, the sensor 70 is similar to the sensors 10, 30 and detailed description of similar elements is omitted.

With reference to FIG. 7, the sensor 70 comprises an absorber 70A, two bridges 70B, two supports 70D, and two supports 70E; only one each of the supports 70D, 70E and the bridges 70B are shown in FIG. 7. A p-n junction thermistor (not shown in FIG. 7) is formed on the absorber 70A. The absorber 70A functions both as an infrared absorber that converts an incident infrared flux F into heat and a sensor responsive to temperature changes caused by this heat.

The bridges 70B and the supports 70D are made from a titanium layer 75; the supports 70E are formed on a contact region 71A that is made by highly doping a region of the polysilicon layer 71. The supports 70D, 70E and the bridges support the absorber 70A above the substrate 1 with a gap M between the absorber 70A and the substrate 1. The bridges 70B and the supports 70D, 70E are situated beneath the absorber 70A with respect to an incident infrared flux F. In addition, the bridges 70B and the supports 70D, 70E electrically connect the contact region 71A of the absorber 70A with the readout electrode 1A. The bridges 70B are similar to the bridges 10B.

As shown in FIG. 7, the absorber 70A comprises the polysilicon layer 71 and silicon nitride layers 72, 73 that cover the polysilicon layer 71. The silicon nitride layer 73 on the upper surface of the polysilicon layer 71 absorbs the incident infrared flux F. Thus, the effective absorption area of the absorber 70A is determined by the silicon nitride layer 73.

Connectors 70F (only one of which is shown in FIG. 7) comprising the contact region 71A are made on the absorber 70A. The contact region 71A is electrically connected to a p-n junction thermistor (not shown in FIG. 7) on the absorber 70A. P-type impurities are implanted in the contact region 71A; the p-doped portion of the contact region 71A is connected to the p-doped portion of the p-n junction thermistor. The n-doped region of the contact region 71A is connected to the n-doped portion of the p-n junction thermistor.

The bridges 70B and supports 70D comprise a titanium layer 75. Silicon nitride layers 76, 77 cover the titanium layer 75. A first end 75A of the titanium layer 75 is electrically connected to the readout electrode 1A of the substrate 1. A second end 75B of the titanium layer 75 is electrically connected to the high-density impurity diffusion layer 71A.

Figure 8A:
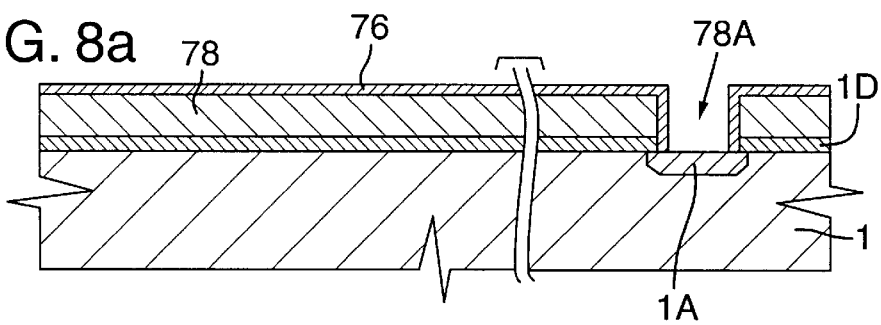

A manufacturing method for the sensor 70 is explained with reference to FIGS. 8(a)–8(g). With reference to FIG. 8(a), a readout electrode 1A is formed in the substrate 1. The substrate 1 is then covered with the silicon nitride layer 1D and the 1.0-$\mu$m thick silicon oxide layer 78. The silicon oxide layer 78 is a first sacrificial layer.

A contact hole 78A is formed in the silicon nitride layer 1D and the silicon oxide layer 78, exposing the electrode 1A on the substrate 1. A 0.2-$\mu$m thick silicon nitride layer 76 is deposited and patterned so that the electrode 1A is exposed. After these steps, the sensor 70 has a structure as shown in FIG. 8(a).

Figure 8B:
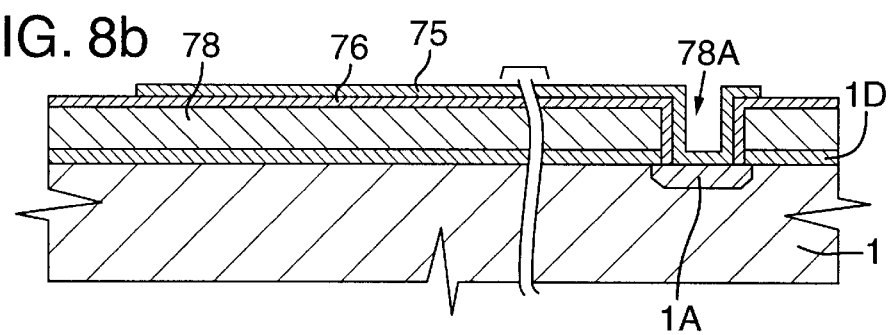

A 0.2-$\mu$m thick titanium layer 75 is deposited to cover the contact hole 78A. The titanium layer 75 provides an electrical connection for the supports 70D and bridges 70B. The titanium layer 75 is photo-patterned and etched. The sensor 70 at this stage has a structure as shown in FIG. 8(b).

Figure 8C:
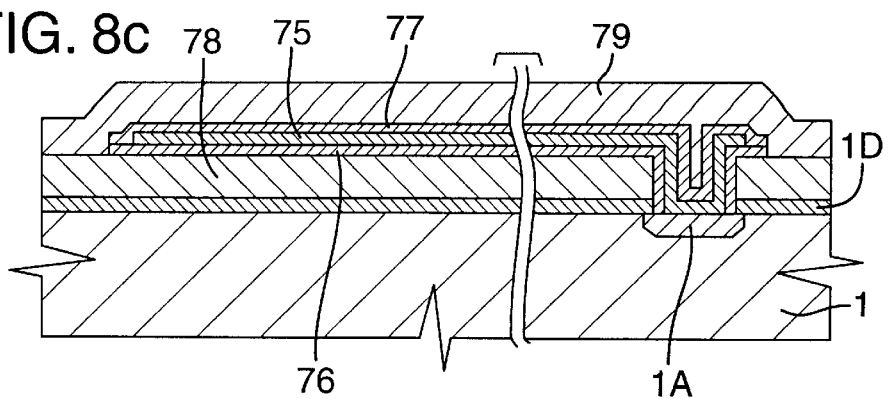

A 0.2-$\mu$m thick silicon nitride layer 77 is deposited, photo-patterned, and etched. A 1.0-$\mu$m thick silicon oxide layer 79 is then deposited. The silicon oxide layer 79 is a second sacrificial layer. The sensor 70 at this stage has a structure as shown in FIG. 8(c). Because these process steps of Example Embodiment 3 are similar to corresponding process steps of Example Embodiment 1, detailed discussion of them is omitted.

A contact hole 79A is formed, exposing the silicon nitride layer 77. A 0.1-$\mu$m thick silicon nitride layer 72 is deposited using CVD or another suitable method. The sensor 70 at this stage has a structure as shown in FIG. 8(d).

A hole is then etched through the layers 72, 79 at the bottom of the contact hold 79A, exposing the titanium layer 75. A 0.5- to 1.0-μm thick polysilicon layer 71 is deposited using, for example, plasma CVD or LPCVD. The polysilicon layer 71 is photo-patterned and etched back to the size of the absorber 70A. The sensor 70 at this stage has a structure as shown in FIG. 8(e).

Figure 8F:
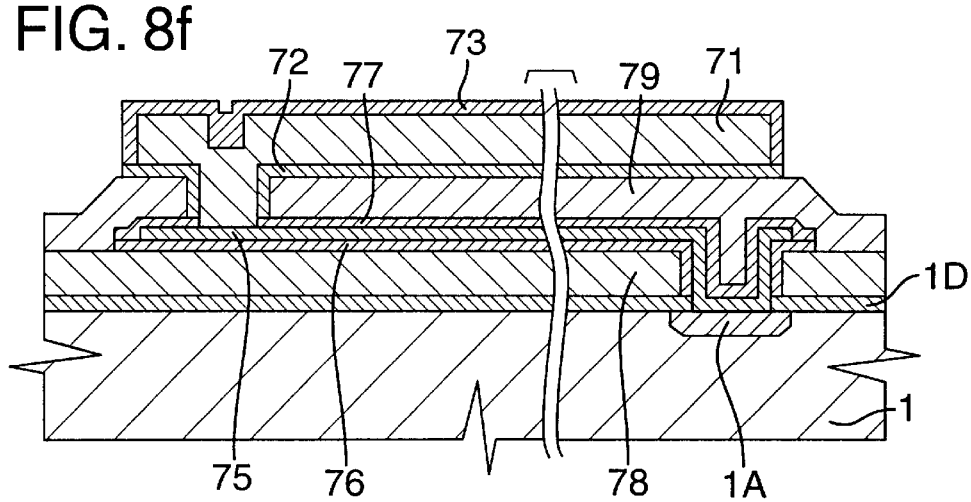

The 0.1-μm thick silicon nitride layer 73 is CVD-deposited, photo-patterned, and etched along with the silicon nitride layer 72. The silicon nitride layer 73 completely covers the polysilicon layer 71. The sensor at this stage has a structure as shown in FIG. 8(f).

The layer 71 is photo-patterned for ion-implantation of p-type impurities and n-type impurities for the contact region 71A. The p- and n-type impurities are also ion-implanted on the polysilicon layer 71 to form a p-n junction (not shown in FIGS. 7 or 8(g)). The p-implanted region of the layer 71A connects to the p-diffused region of the p-n junction, and the n-implanted region connects to the n-diffused region of the p-n junction.

Figure 8G:
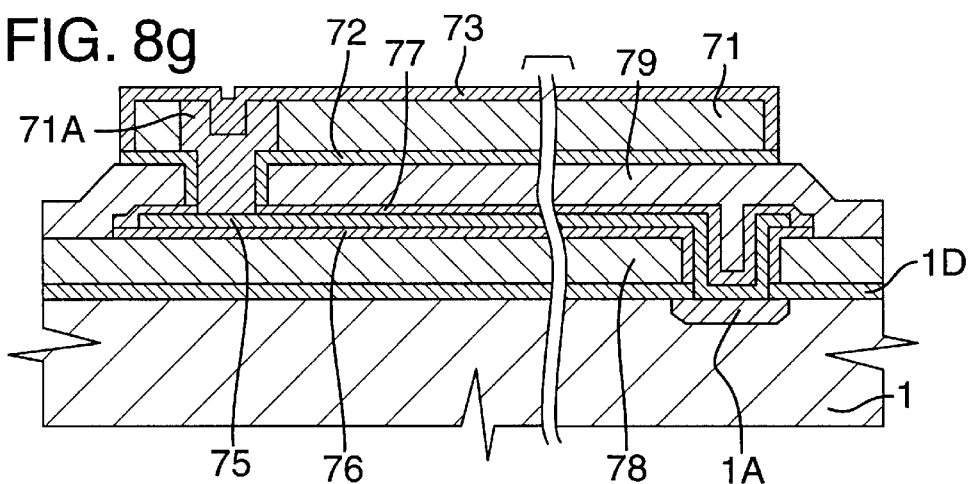

The contact region 71A is electrically connected to the end 75B of the titanium layer 75, thereby electrically connecting the p-type diffusion layer or the n-type diffusion layer (neither of which is shown in FIG. 8(g)) of the p-n junction with the titanium layer 75. The contact region 71A is ion-implanted with a dose of $5 \times 10^{15}$ cm$^{-2}$ at an acceleration voltage of 150 kV. These conditions produce a sufficiently high doping density near the titanium layer 75. The sensor 70 is annealed in a nitrogen atmosphere at a temperature of 1000 C for 60 minutes.

The p-type and n-type impurities for the p-n junction (not shown) are ion-implanted with doses of, for example, $5 \times 10^{14}$ cm$^{-2}$ to $1 \times 10^{15}$ cm$^{-2}$ at an acceleration voltage of 150 kV, followed by annealing in a nitrogen atmosphere at a temperature of 600 C for 60 minutes. The sensor 70 at this stage has a structure as shown in FIG. 8(g).

Finally, etching in a hydrofluoric acid solution removes the silicon oxide layers 78, 79 (the first and second sacrificial layers). Removal of the silicon oxide layers 78, 79 produces the sensor 70 shown in FIG. 7.

As in the sensors 10, 30 of Example Embodiments 1–2, the sensor 70 can have a separate absorption layer or the silicon nitride layer 73 can serve as the infrared absorption layer. As shown in FIG. 7, the bridges 70B are situated beneath the absorber 70A, thereby increasing the area available for absorption of infrared radiation and thereby permitting an increased aperture ratio. In addition, in Example Embodiment 3, the polysilicon layer 71 is highly doped at the supports 70E, eliminating the need to make a through-hole in the absorber 70A, such as the through-hole 24 of Example Embodiment 1.

It will be apparent that imaging devices using sensors such as the sensor 70 permit an increased aperture ratio. The increased aperture ratio, in turn, permits imaging devices with improved image resolution or increased temperature resolution.

Example Embodiment 4

Figure 9:
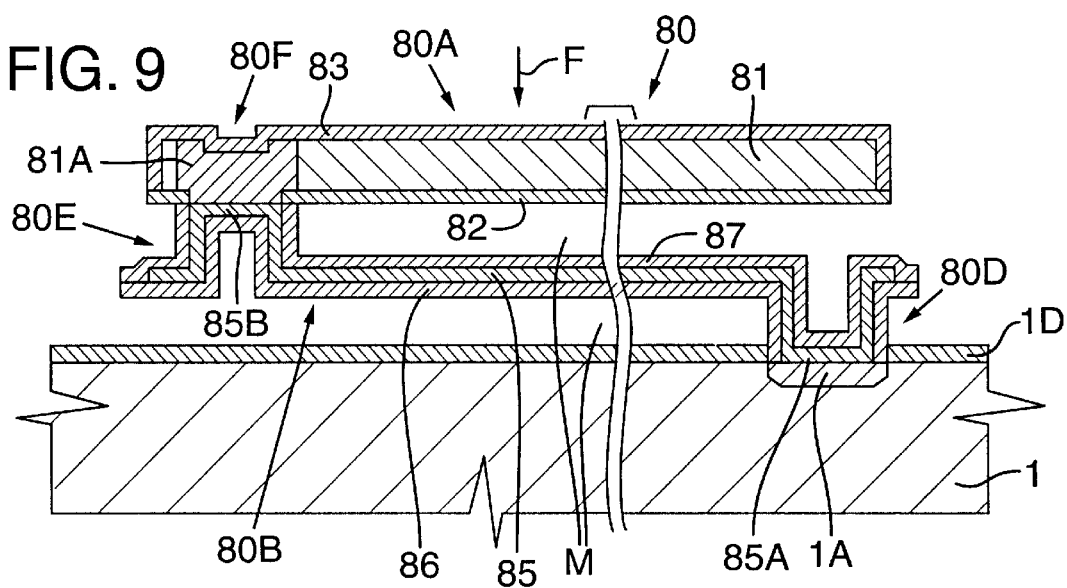
FIG. 9 is an elevational sectional view of a thermal infrared sensor according to Example Embodiment 4.

With reference to FIG. 9, a thermal imaging device according to Example Embodiment 4 comprises an array of thermal infrared sensors on a substrate 1, typically a semiconductor such as silicon. A single exemplary sensor 80 of the array is shown in FIG. 9. The sensor 80 differs from the sensor 10 of Example Embodiment 1 in that the sensor 80 has supports 80D, 80E made of the same metal layer (for example, a titanium layer 85) as used for the bridges 80B. Other features of Example Embodiment 4 are similar to those of Example Embodiment 1 and detailed descriptions of such features are omitted.

Referring further to FIG. 9, the sensor 80 comprises an absorber 80A, the bridges 80B, and the supports 80D, 80E. A p-n junction thermistor (not shown in FIG. 9) is formed on the absorber 80A. The absorber 80A absorbs an incident infrared flux F, converting the flux F into heat to which the thermistor responds.

The bridges 80B and the supports 80D, 80E are formed from the titanium layer 85 and support the absorber 80A above the substrate 1, forming a gap M between the absorber 80A and the substrate 1. The bridges 80B and the supports 80D, 80E are situated beneath and completely covered by the absorber 80A with respect to the incident infrared flux F.

The absorber comprises a polysilicon layer 81 that is covered by silicon nitride layers 82, 83. The titanium layer 85 is both a support for and an electrical connection to the absorber 80A. A contact region 81A is formed by highly doping the polysilicon layer 81 of the absorber 80A. The contact region 81A electrically connects to the titanium layer 85 and thus to the readout electrode 1A on the substrate 1. In addition, the contact region 81A electrically connects to the p-n junction thermistor.

As in the previously described Example Embodiments, the bridges 80B are flat, L-shaped members that are approximately parallel to the absorber 80A. Because silicon nitride absorbs infrared radiation, the effective absorption area of the sensor 80 is defined by the silicon nitride layer 83. A connector 80F is formed on the absorber 80A and the contact region 81A is part of the connector 80F.

Referring further to FIG. 9, the bridges 80B and the supports 80D, 80E are formed by the titanium layer 85 and the silicon nitride layers 86, 87 that cover the titanium layer 85. In addition, a first end 85A of the titanium layer 85 is electrically connected to the readout electrode 1A on the substrate 1 and a second end 85B is electrically connected to the contact region 81A. In this case, the first end 85A of the titanium layer 85 is part of the support 80D while the second end 85B is part of the support 80E.

A manufacturing method for the sensor 80 is described with reference to FIGS. 10(a)–10(h). First, a readout electrode 1A is formed in the substrate 1. The substrate 1 is covered with a silicon nitride layer 1D and a 2.0-μm thick silicon oxide layer 88. The silicon oxide layer 88 is photo-patterned and etched, producing a 1.0-μm high extension 88A for forming a connection from the absorber 80a to the bridges 80B. The silicon oxide layer 88 is a first sacrificial layer.

Figure 10A:
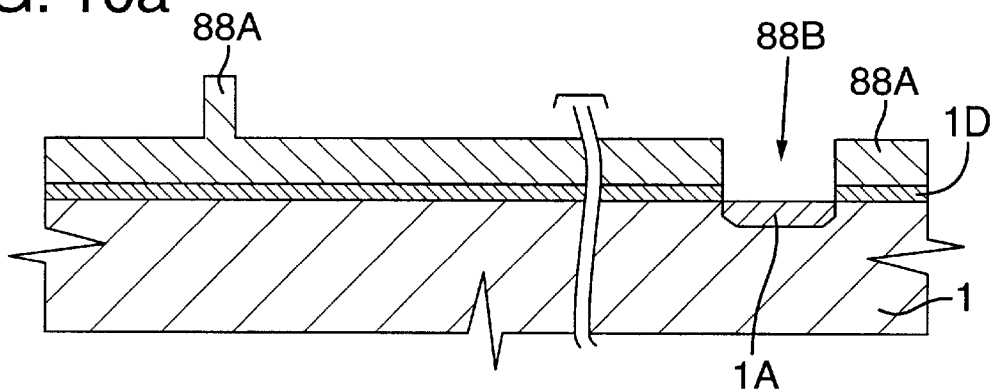
FIGS. 10(a)–10(h) are elevational sectional views of the thermal infrared sensor of FIG. 9 illustrating a preferred embodiment of a manufacturing process for making such a sensor.

Next, the silicon oxide layer is photo-patterned and etched to form a contact hole 88B in the silicon oxide layer 88 and the silicon nitride layer 1D, exposing the readout electrode 1A. The sensor 80 at this stage has a structure as shown in FIG. 10(a).

Figure 10B:
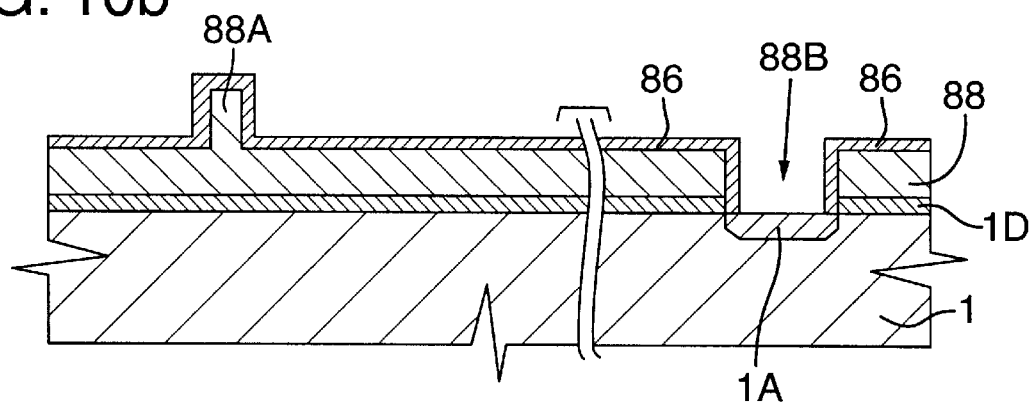

A 0.2-μm thick silicon nitride layer 86 is deposited, patterned, and etched so that the readout electrode 1A in the contact hole 88B remains exposed. The sensor 80 at this stage has a structure as shown in FIG. 10(b).

Figure 10C:
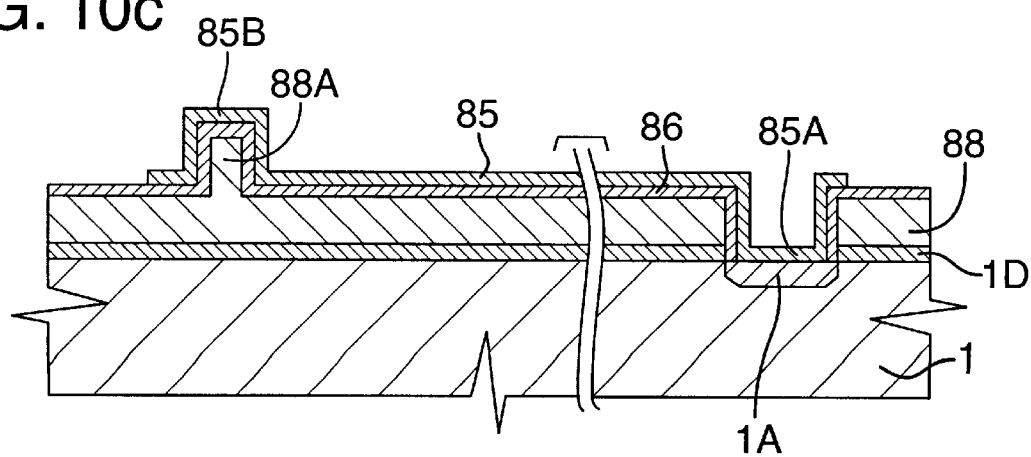

The 0.2-μm thick titanium layer 85 is sputter-deposited, photo-patterned, and etched. The titanium layer 85 is patterned to contact the readout electrode 1A. The titanium layer 85 forms part of the supports 80D, 80E and bridges 80B. The titanium layer 85 also functions as an electrical connection of the readout electrode 1A with the absorber 80A. After these steps are complete, the sensor has a structure as shown in FIG. 10(c).

Figure 10D:
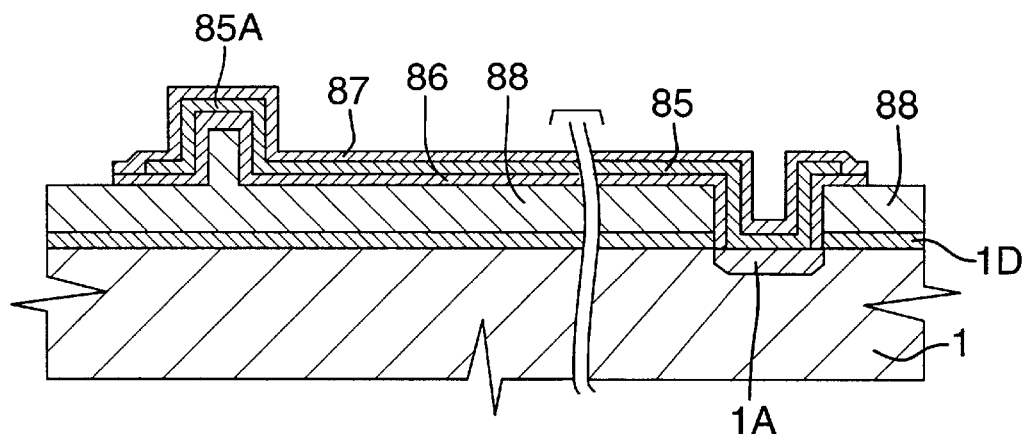

A 0.2-μm thick silicon nitride layer 87 is CVD-deposited, photo-patterned, and etched. The silicon nitride layer 87 completely covers the titanium layer 85. The silicon nitride layer 87 also functions as a protective layer. The sensor 80 at this stage has a structure as shown in FIG. 10(d).

Figure 10E:
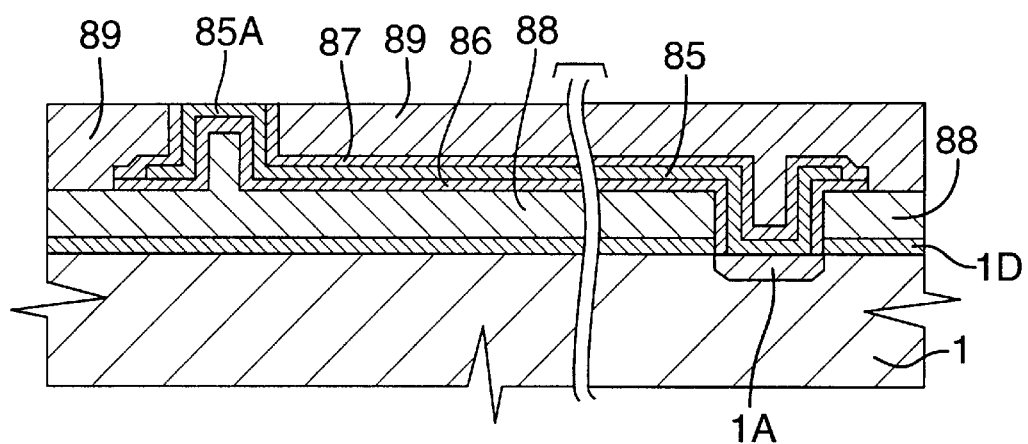

A 1.0 μm silicon oxide layer 89 is CVD-deposited. The silicon oxide layer 89 is a second sacrificial layer. The surface of the substrate 1 is then planarized by applying a spun-on-glass ("SOG") layer, using, for example, a Tokyo Ohka glass type OCD-600 with a 3-time rotation application. The SOG layer is not shown in FIGS. 10(a)–10(h). After the SOG layer is applied, the substrate 1 is dry-etched to expose the end 85B of the titanium layer 85. The sensor 80 has a structure as shown in FIG. 10(e).

Figure 10F:
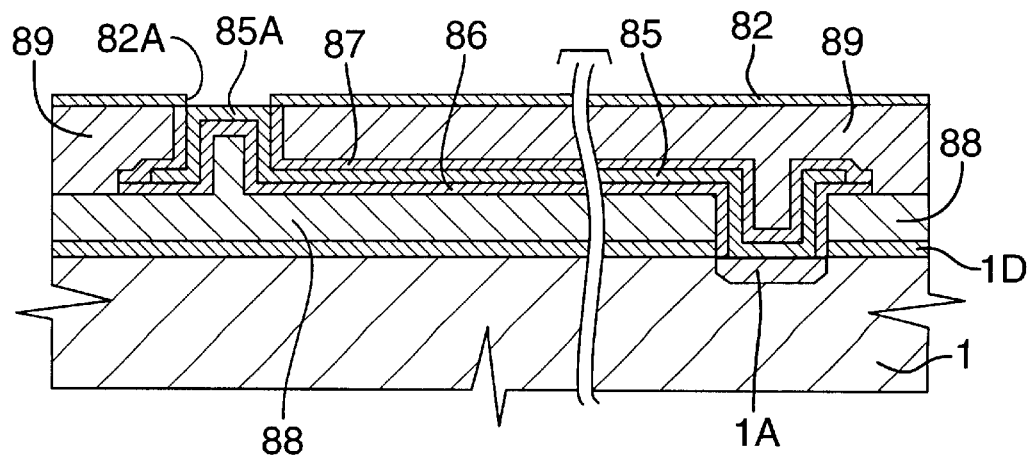

The 0.1-μm thick silicon nitride layer 82 is then CVD-deposited. An aperture 82A is formed by photo-patterning and etching, exposing the titanium layer 85. The sensor 80 is then as shown in FIG. 10(f).

Figure 10G:
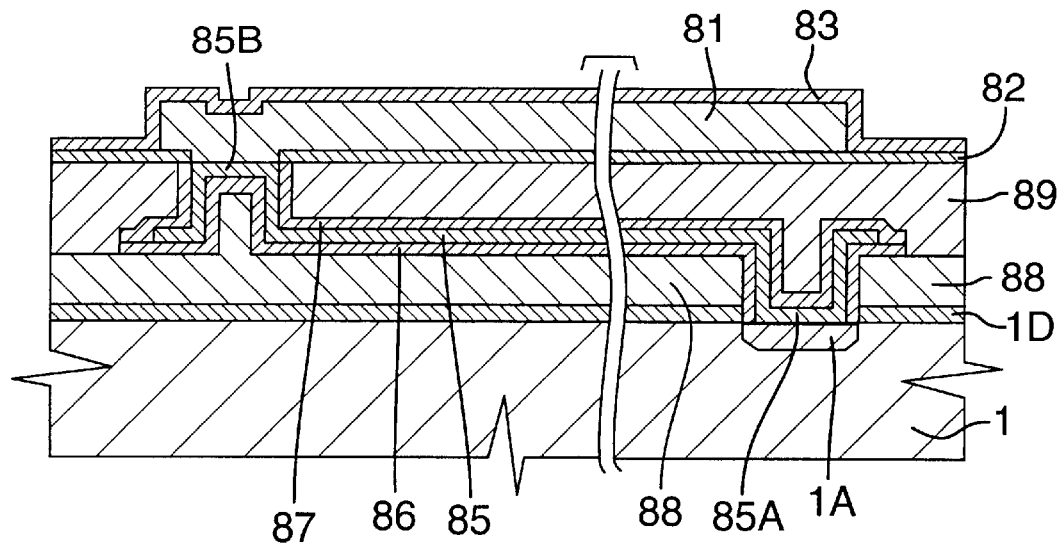

Next, a 0.5- to 1.0-μm thick polysilicon layer 81 is deposited using, for example, plasma CVD or LPCVD. The polysilicon layer 81 is photo-patterned and etched to the size of the absorber 80A. The 0.1 μm silicon nitride layer 83 is CVD-deposited, covering the polysilicon layer 81. The sensor 80 at this stage has a structure as shown in FIG. 10(g).

Figure 10H:
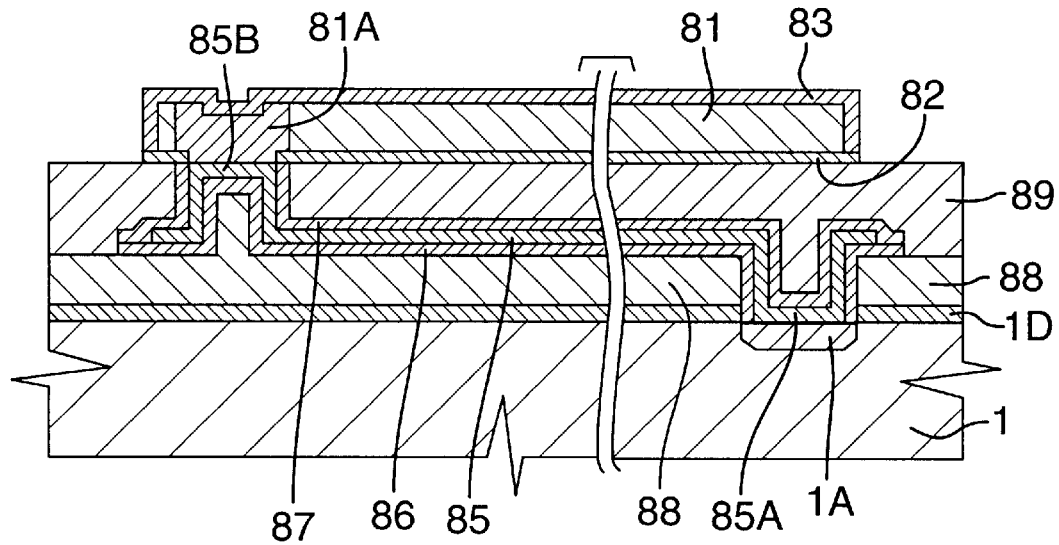

The silicon nitride layers 82, 83 are photo-patterned and etched. The silicon nitride layer 83 covers only the polysilicon layer 81. Photo-patterning and ion-implantation are employed to introduce p- and n-type impurities at specified locations on the polysilicon layer 81, forming two contact regions 81A (only one of which is shown in FIG. 10(h)). Using the same process, p- and n-type impurities are implanted into the polysilicon layer 81 to make the p-n junction thermistor (not shown). The p-doped regions of the contact regions 81A are electrically connected to the p-doped regions of the p-n junction thermistor. Similarly, the n-doped regions of the contact regions 81A are electrically connected to the n-doped regions of the p-n junction thermistor. As in Example Embodiment 2, ion-implantation is performed so that the contact regions 81A are doped down to a conducting layer (the titanium layer 85). Finally, the sacrificial silicon oxide layers 88, 89 are removed by wet etching with a hydrofluoric acid etch, producing the sensor 80 as shown in FIG. 9.

In Example Embodiment 4, the silicon nitride layer 83 covering the absorber 80A is an absorption layer for the incident infrared flux. Therefore, a large aperture ratio is obtained. A separate absorption layer can be provided on the absorber 80A, as previously discussed with reference to Example Embodiments 1–3. Moreover, as shown in FIG. 9, the bridges 80B are situated beneath the infrared absorption layer (not shown) of the absorber 80A and thus do not block the incident flux.

Since the bridges 80B and the supports 80D, 80E are constructed of the same titanium layer 85, manufacture of the sensor 80 is simple. Because the titanium layer 85 is electrically connected to the absorber 80A, a through-hole in the absorber 80A for electrical connections is unnecessary. In addition, because the polysilicon layer 81 is deposited after the surface is flattened by the SOG layer, a high-quality polysilicon layer 81 is formed, increasing the temperature sensitivity of the sensor 80.

It will be apparent that a plurality of sensors such as the sensor 80 can be arranged to form an imaging device. Because the supports 80D, 80E and the bridges 80B are situated beneath the absorber 80A, a larger surface area is available for infrared absorption in comparison with conventional imaging devices. Therefore, such an imaging device can have a larger aperture ratio. If the aperture ratio is larger, then improved imaging devices are possible comprising either a larger number of sensors or a sensor having improved temperature sensitivity.

Example Embodiment 5

Figure 11:
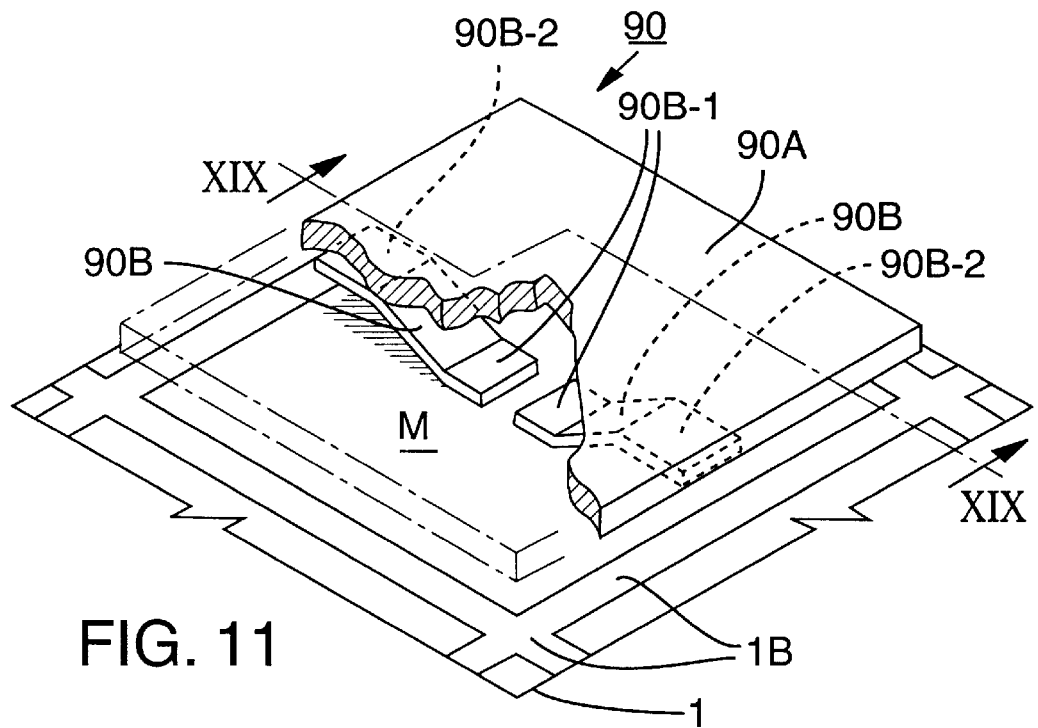
FIG. 11 is a perspective view (with partial cutaway) of a thermal infrared sensor according to Example Embodiment 5.

With reference to FIG. 11, a thermal infrared sensor 90 according to Example Embodiment 5 comprises an absorber 90A that is attached to a substrate 1 by tilted bridges 90B. The tilted bridges 90B are located between the absorber 90A and the substrate 1 and hold the absorber 90A above the substrate 1, forming gaps M between the absorber 90A and the tilted bridges 90B and between the tilted bridges 90B and the substrate 1. Because the absorber 90A is situated above the substrate 1, heat conduction from the absorber 90A to the substrate 1 is reduced. In addition, the tilted bridges 90B are thin and have small cross-sections and thus have high thermal resistances. Isolation bands 1B are provided to reduce conduction between adjacent sensors in an array of such sensors.

The absorber 90A of the sensor 90 comprises a polysilicon layer 91 and silicon nitride layers 92, 93. The polysilicon layer 91 comprises a contact region 91A doped with an impurity. The tilted bridges 90B are made of a conducting layer 95 interposed between silicon nitride layers 96, 97. The tilted bridges 90B have contacts 90B-2, 90B-2 by which the tilted bridges 90 are mounted to the absorber 90A and the substrate 1, respectively. In addition, the substrate 1 is covered by a silicon nitride layer 1D.

Figure 12:
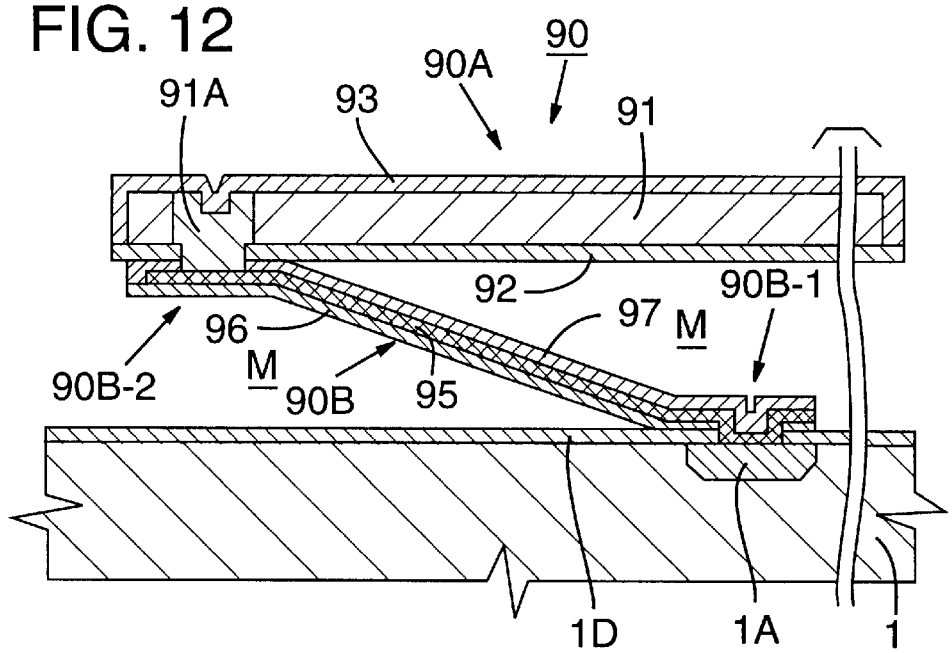
FIG. 12 is an elevational sectional view of the thermal infrared sensor according to Example Embodiment 5.

The conducting layer 95 electrically connects a readout electrode 1A on the substrate 1 to the contact region 91A of the absorber. A thermal sensing element (not shown in FIGS. 11–12) is provided on the absorber 90A and is electrically connected to the contact region 91A. The tilted bridges 90B thus hold the absorber 90A away from the substrate, so as to reduce heat transfer, while providing an electrical connection to the readout electrode.

In contrast to the sensors of Example Embodiments 1–4, the sensor 90 is supported above the substrate 1 without a micro-bridge. The sensors of Example Embodiments 1–4 comprise supports that hold a bridge above the substrate and that hold the absorber above the bridge. Gaps between the absorber, substrate, and bridges are determined by the height of the supports. In the sensor 90, the tilts of the tilted bridges 90B provide the necessary gaps, and the tilted bridges 90B are attached directly to the substrate 1 and the absorber 90A.

A manufacturing process for a thermal infrared sensor according to Example Embodiment 5 is described with reference to FIGS. 13(a)–13(j). The silicon substrate 1 is provided with a readout electrode 1A and covered with the silicon nitride layer 1D. A first silicon oxide sacrificial layer 94 is CVD-deposited onto the silicon nitride layer 1D. The thickness h1 of the silicon oxide layer 94 determines the separation between the substrate 1 and the absorber 90A.

Figure 13A:
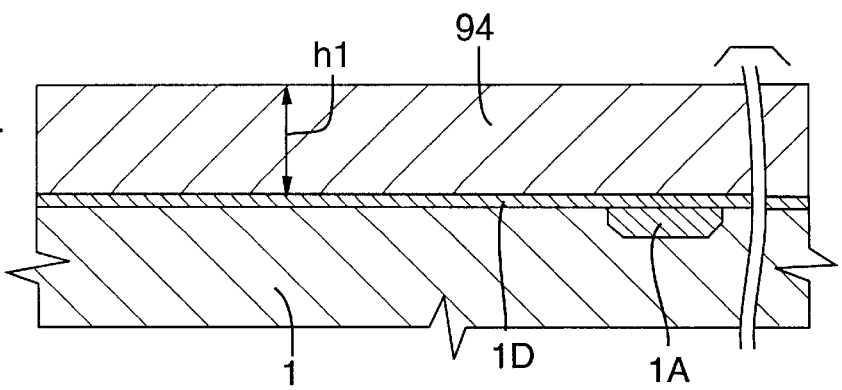
FIGS. 13(a)–13(j) are elevational sectional views of the thermal infrared sensor of FIGS. 11–12, illustrating a preferred embodiment of a manufacturing process for making such a sensor.
Figure 13B:
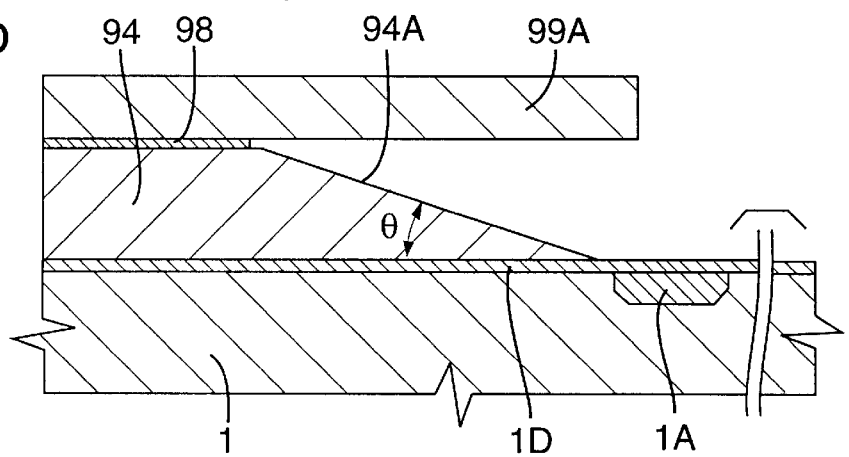

A silicon oxide layer 98 that etches rapidly is deposited on the silicon oxide layer 94. A resist layer 99A is coated on the silicon oxide layer 98. The silicon oxide layer 94 is etched to form a taper angle θ in a region beneath the eventual location of the absorber 90A. The silicon oxide layers 94, 98 are etched in a hydrofluoric acid etching solution. Because the silicon oxide layer 98 etches rapidly, the silicon oxide layer 94 etches faster in a direction parallel to the plane of the substrate 1 than in a direction perpendicular to the plane of the substrate 1. The silicon oxide layer 94 thus becomes tapered, as shown in FIG. 13(b). By adjusting the etch rates of the silicon oxide layers 94, 98, the taper angle θ and properties of the tapered surface 94A can be controlled. After etching is complete, the resist 99A is removed.

Figure 13C:
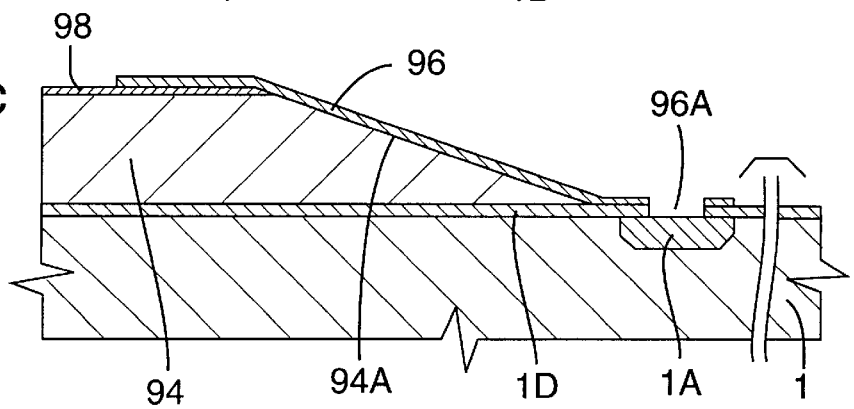

With reference to FIG. 13(c), a 0.2-μm thick silicon nitride layer 96 is deposited, photo-patterned, and etched. The silicon nitride layer 96 is a part of a tilted bridge 90B. Etching is performed using a dry-etch process in a gas atmosphere of $CF_4$ at a pressure of 0.4 Torr and an RF power of 200 W. A contact hole 96A in the silicon nitride layers 1D, 96 is made by photo-patterning and etching above the readout electrode 1A. The sensor 90 at this stage has a structure as shown in FIG. 13(c).

Figure 13D:
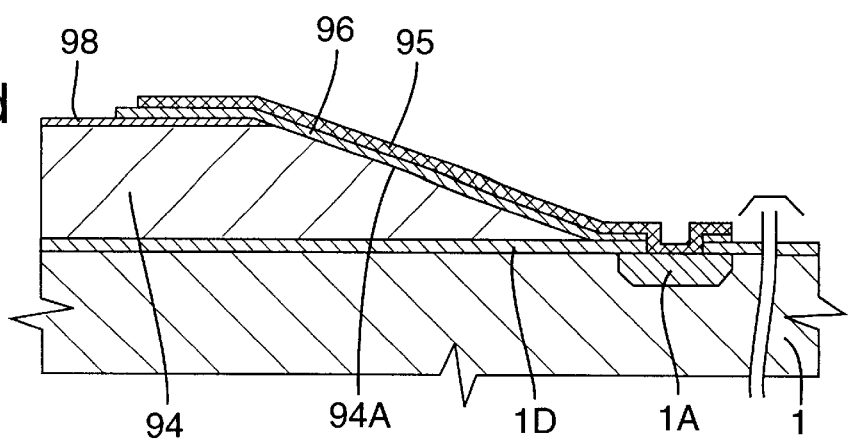

With reference to FIG. 13(d), the 0.2 μm titanium layer 95 is then deposited by sputtering. Titanium is selected because it is an electrical conductor with a relatively low thermal conductivity. The titanium layer 95 is photo-patterned and dry-etched to electrically contact the readout electrode 1A. Etching is performed in a gas flow of 25 sccm of $CHCl_3$, 20 sccm of $Cl_2$, 40 sccm of $BCl_3$, and 120 sccm of $N_2$ at a pressure of 0.3 Torr and an RF power of 180 W.

Figure 13E:
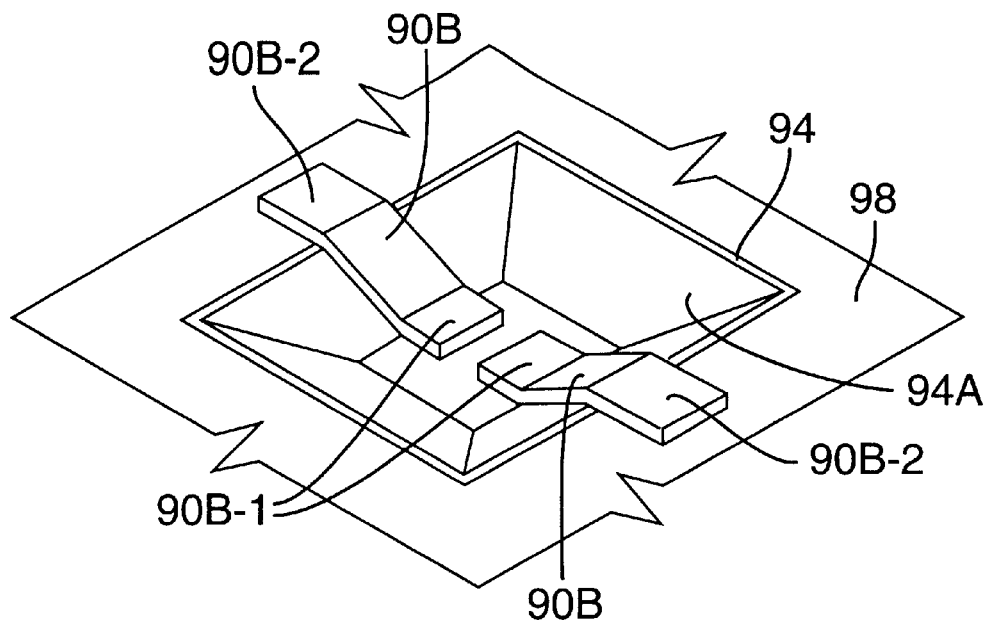

After etching, the tilted bridges 90B are supported by the tapered surface 94A, the contacts 90B-1 are attached to the substrate 1, and the contacts 90B-2 are supported by the silicon oxide layer 98, as shown in FIG. 13(e).

Figure 13F:
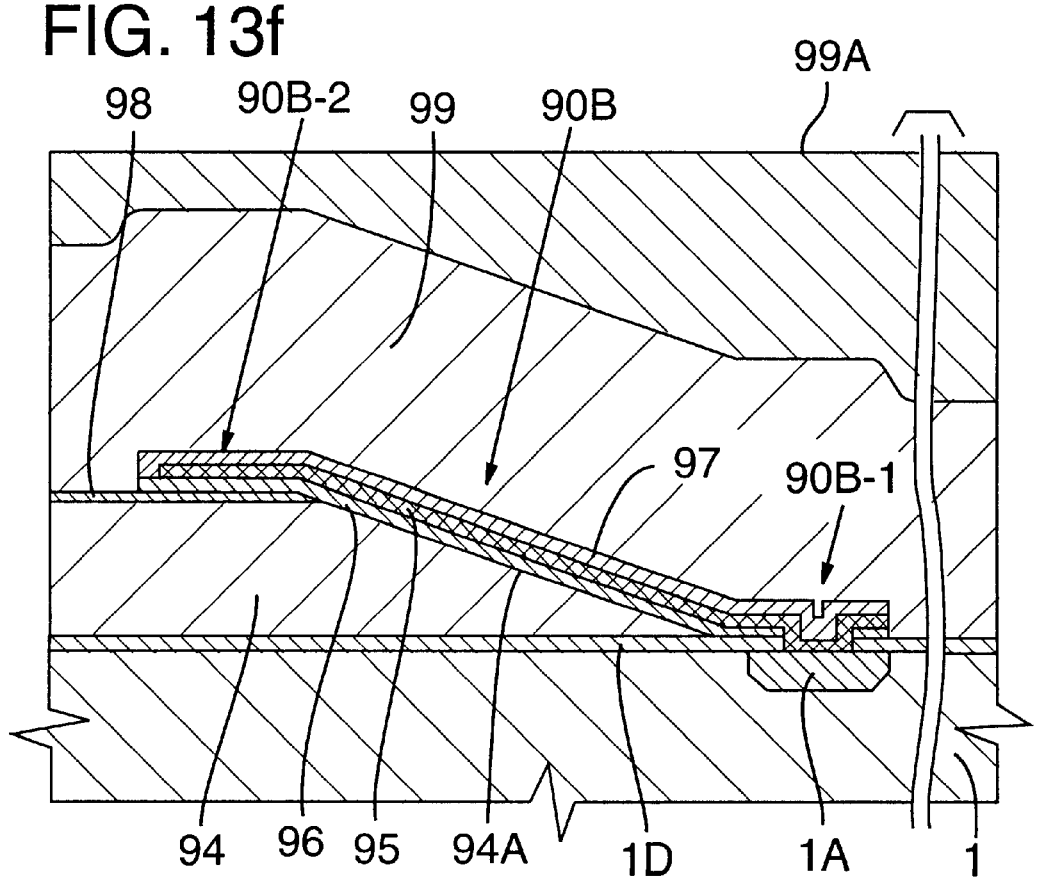

With reference to FIG. 13(f), the 0.2-μm thick silicon nitride layer 97 is deposited, photo-patterned, and etched, leaving the titanium layer 95 covered. A second sacrificial silicon oxide layer 99 (specifically $SiO_2$) is CVD-deposited. The surface is planarized by applying an SOG layer 99B. After these steps are complete, the sensor has a structure as shown in FIG. 13(f).

Figure 13G:
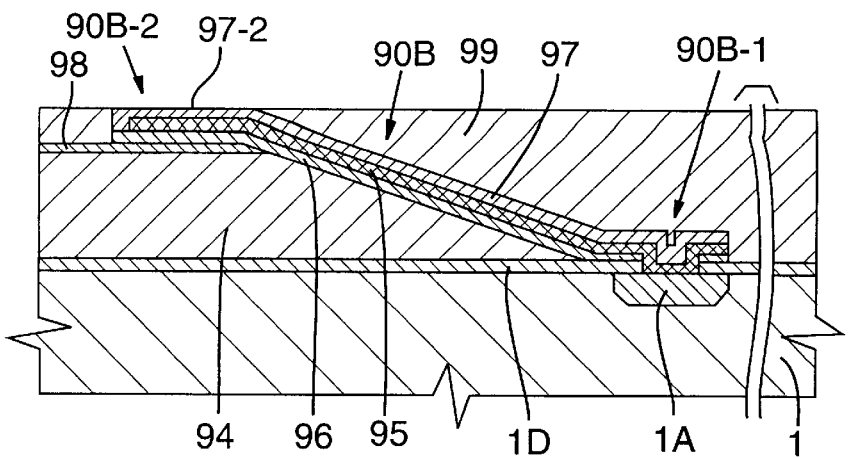

With reference to FIG. 13(g), the silicon oxide layer 99 and the 50G layer 99B are etched, partially exposing the silicon nitride layer 97 at the contact 90B-2 in a region 92. The etching is done with a dry-etching process in a gas flow containing 32 sccm of $CHF_3$, 16 sccm of $CF_4$, and 98 sccm of He at a pressure of 0.5 Torr; the RF power is 200 W at a frequency of 400 kHz. The sensor 90 at this stage has a structure as shown in FIG. 13(g).

Figure 13H:
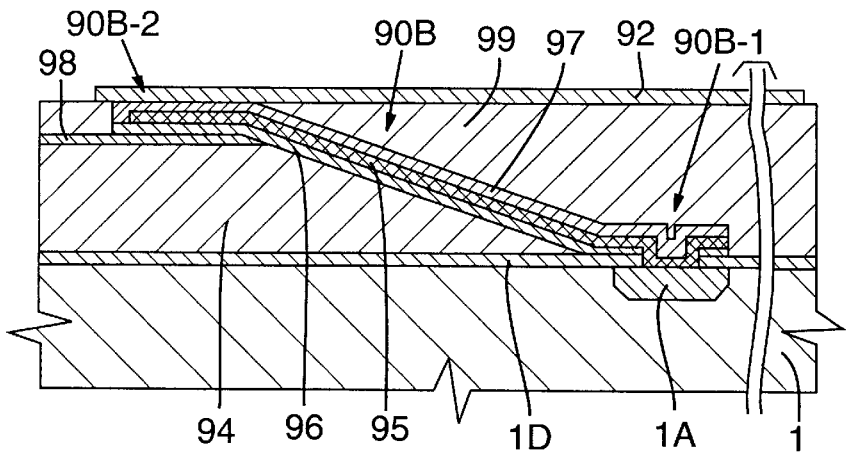

With reference to FIG. 13(h), a 0.2-μm thick silicon nitride layer 92 is deposited. As shown in FIG. 12(h), a through-hole is opened by photo-patterning and etching the silicon nitride layers 92, 97, exposing the titanium layer 95 at the contact 90B-2. A 0.5-μm thick polysilicon layer 91 is deposited by either plasma CVD or LPCVD. Plasma CVD is preferably performed in a flowing-gas atmosphere comprising 300 sccm of $SiH_4$ and 7 sccm of Ar at a temperature of 300 C and a pressure of 1.2 Torr with an RF power of 3 kW at a frequency of 430 kHz. The polysilicon layer 91 supports the thermal sensing element, such as a thermistor, and can be patterned to the size of a pixel for an imaging device.

Figure 13I:
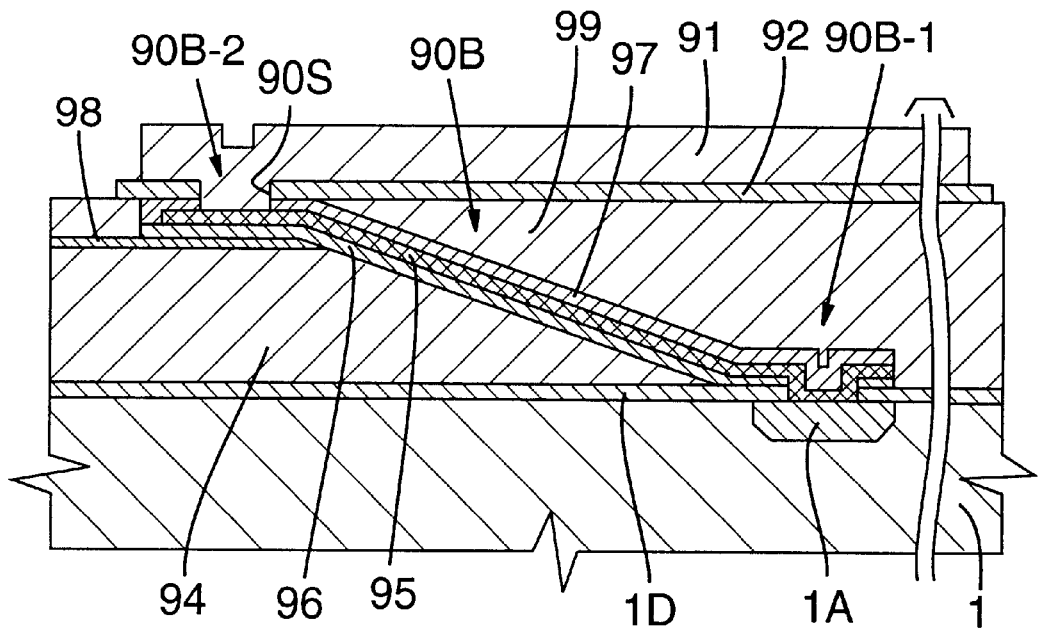

The polysilicon layer 91 is dry-etched in a flowing-gas atmosphere comprising, for example, 40 sccm of $SF_6$ and 20 sccm of $CHClF_2$, at a pressure of 0.18 Torr and an RF power of 75 W. The sensor 90 at this stage has a structure as shown in FIG. 13(i).

Figure 13J:
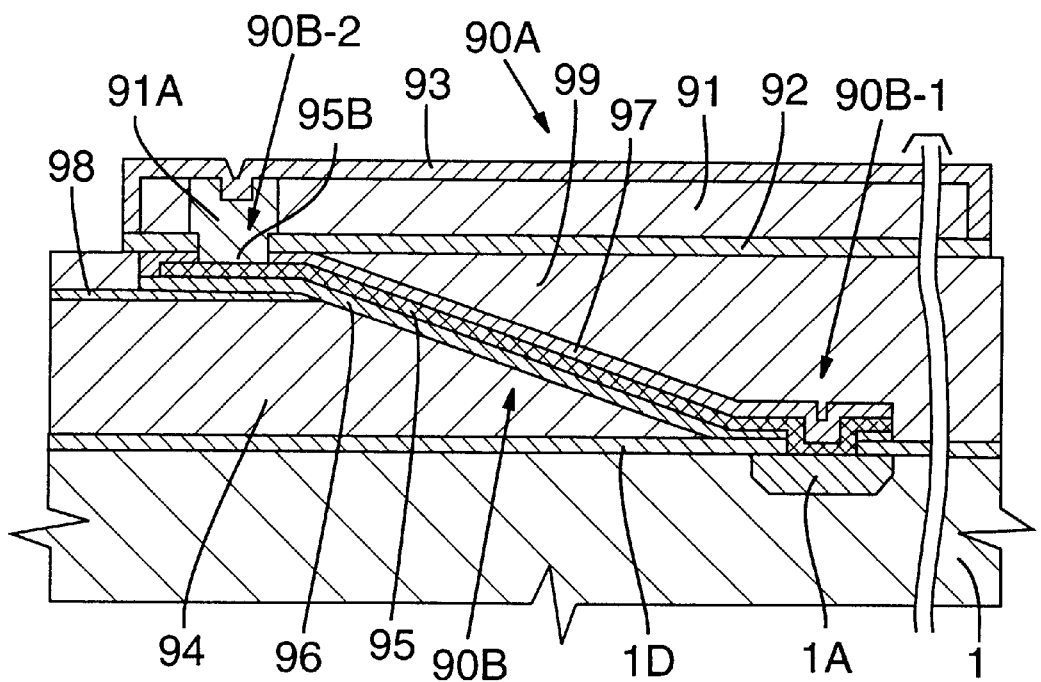

With reference to FIG. 13(j), the 0.1-μm thick silicon nitride layer 93 is CVD-deposited to protect the polysilicon layer 91. P- and n-type impurities are ion-implanted using photo-patterning to define implant locations, followed by annealing in a nitrogen atmosphere at 600 C for 60 minutes to activate the impurities and form a p-n junction thermistor (not shown) and a contact region 91A. The impurities are implanted with sufficient density in the contact region 91A for the contact region to electrically connect to the titanium layer 95. For example, ion implantation can be performed with boron with a dose of $5 \times 10^{15}$ $cm^{-2}$ at an acceleration voltage of 200 kV. After these steps, the sensor 90 has a structure as shown in FIG. 13(j).

The silicon oxide sacrificial layers 94, 99, 98 are removed using a hydrofluoric acid etch solution containing, for example, 1 part HF to 10 parts $NH_4F$. The protective silicon nitride layers 92, 93 are not removed. The etch forms the tilted bridge 90B that holds the absorber 90A above the substrate 1 and electrically connects the absorber 90A to the substrate 1.

As in Example Embodiments 1–4, the silicon nitride layer 93 serves as an infrared absorption layer. It will be apparent that a special infrared absorption layer can be provided.

Example Embodiment 6

Figure 14:
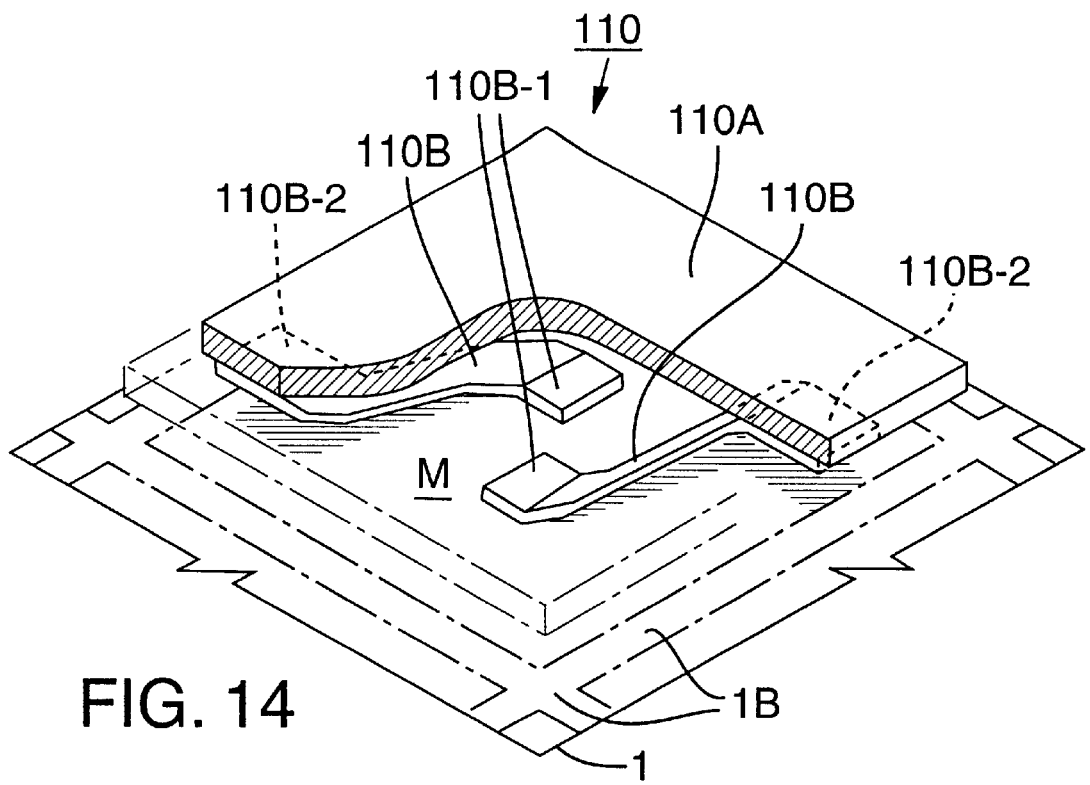
FIG. 14 is a perspective view (with partial cutaway) of a thermal infrared sensor according to Example Embodiment 6.
Figure 15:
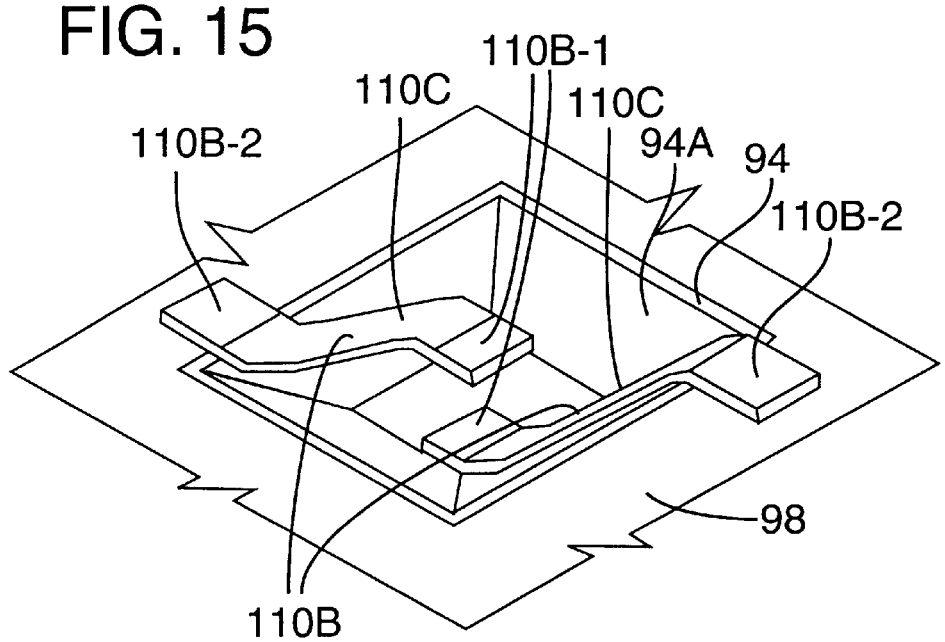
FIG. 15 is a perspective view of a portion of the sensor of FIG. 14 showing one possible arrangement of bridges.

With reference to FIG. 14, a thermal infrared sensor 110 comprises an absorber 110A supported above a substrate 1 by tilted bridges 110B. The tilted bridges 110B comprise contacts 110B-1 that connect to the substrate 1 and contacts 110B-2 that connect to the absorber 110A. The sensor 110 is similar to the sensor 90 but the arrangement of the tilted bridges 110B differs from that of the tilted bridges 90B. With reference to FIG. 15, the tilted bridges 110B have different heights. As shown in FIG. 15, ramp portions 110C for the bridges 110B differ. In addition, one of the bridges 110B attaches to the absorber 110A and the substrate 1 while the other attaches to the absorber and the silicon oxide layer 98.

Figure 16:
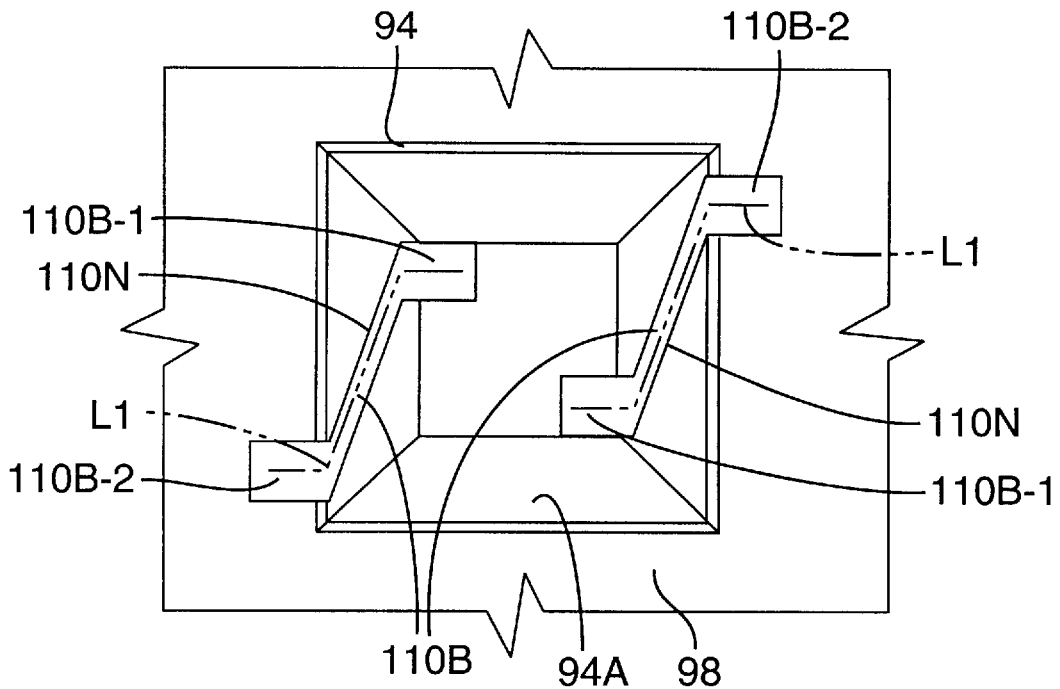
FIG. 16 is a perspective view of a portion of a sensor such as that shown in FIG. 14, but having an alternate arrangement of bridges.
Figure 17:
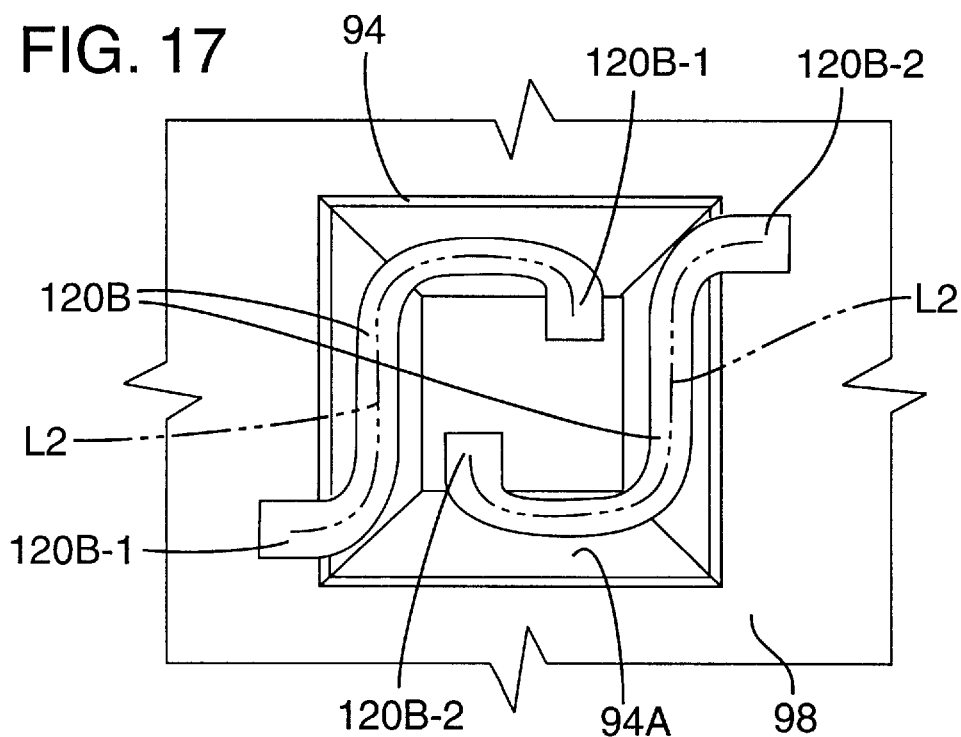
FIG. 17 is a perspective view of a portion of a sensor such as that shown in FIG. 14, but having another alternative arrangement of bridges.

It will be apparent that other arrangements of tilted bridges are possible. For example, with reference to FIG. 16, the bridges 110B can have a narrowed section 110N between the contact 110B-1, 110B-2. The narrowed section 110N further reduces heat conduction. The bridges 110B of FIG. 16 also have an additional lateral offset, permitting longer bridges. FIG. 17 depicts yet another example in which the tilted bridges 120B are curved between the contacts 120B-1, 120B-2, reducing heat conduction. Other configurations will be apparent to those skilled in the art.

While the sensors of the Example Embodiments preferably use p-n junction thermistors, other heat-sensitive devices such as resistance-type bolometers, Schottky barrier thermistors ("SBTs"), pyroelectric sensors, thermocouples, or thermopiles can be substituted.

The Example Embodiments comprise bridges and supports that serve as electrical connections. Because the supports and electrical connections are located beneath and are thus covered by the absorber in each Example Embodiment, a high aperture ratio is achieved. Nevertheless, it will be apparent that the supports need not be completely covered by the absorber in order to increase the aperture ratio.

A sensor according to any of the Example Embodiments 1–6 can include a groove etched into the substrate below the absorbers or holes etched into the substrate. The groove and holes further reduce heat transfer from the absorber to the substrate.

The bridges of Example Embodiments 1–4 are L-shaped sections of plane parallel plates. However, other bridge shapes are suitable. Bridges having long, thin sections with high thermal resistances being preferred.

It will be apparent that the fabrication processes of the Example Embodiments are not limited to particular film deposition, patterning, or etching methods. The methods shown are merely illustrative.

The sensors are well-suited for detection and imaging of infrared fluxes. But, by providing absorbing layers sensitive to other radiation fluxes, these other fluxes can be detected and imaged.

Having illustrated and demonstrated the principles of the invention in example embodiments, it should be apparent to those skilled in the art that these embodiments can be modified in arrangement and detail without departing from such principles. We claim as the invention all that comes within the scope of these claims.

What is claimed is:

1. A thermal infrared sensor for detecting an incident infrared flux, comprising:
    (a) a substrate comprising a surface and a readout region;
    (b) an absorber for receiving the incident infrared flux and converting the infrared flux into a heat flux;
    (c) a thermal sensing element to which the absorber is laminated, the thermal sensing element being responsive to the heat flux, configured to convert the heat flux into an electrical signal, and electrically connected to the substrate, wherein the thermal sensing element comprises a polysilicon layer and a contact region, the contact region being formed by diffusing an impurity into the polysilicon layer and outputting the electrical signal to the readout region; and
    (d) at least one bridge supporting the thermal sensing element above the substrate and forming a gap between the thermal sensing element and the substrate, each bridge comprising an electrically conducting layer and being disposed beneath the absorber so that the respective bridge is hidden by the absorber when viewed from above the absorber.

2. The thermal infrared sensor of claim 1, wherein the electrically conducting layer of each bridge is a titanium layer.

3. The thermal infrared sensor of claim 1, wherein each bridge is tilted with respect to the surface of the substrate.

4. An imaging device for forming an electrical image signal from an incident infrared flux, comprising:
    (a) a semiconductor substrate;
    (b) an array of rows and columns of thermal infrared sensors attached to the substrate, each sensor comprising
        (1) an absorber comprising a polysilicon layer, a front surface for receiving the infrared flux, and a rear surface;
        (2) at least one bridge comprising an electrically conducting layer of titanium;
        (3) a first support comprising a tungsten layer and that attaches each bridge to the substrate, holds the bridge above the substrate, and electrically connects the electrically conducting layer of each bridge to the substrate;
        (4) a contact region in the absorber formed by doping the absorber with a p- or n-type impurity;
        (5) a second support comprising a tungsten layer that attaches to each bridge and to the rear surface of the absorber, holds the absorber above each bridge, and electrically connects the contact region to the electrically conducting layer of each bridge;
        (6) a thermistor attached to the front surface of the absorber; and
        (7) a readout electrode situated on the substrate, the readout electrode receiving an electrical signal from the thermistor; and
    (c) isolation bands, parallel to the rows and columns of the array, that separate the sensors of the array from one another.

5. A thermal infrared sensor for detecting an incident infrared flux, comprising:
    (a) a substrate comprising a surface and a readout region;
    (b) an absorber for receiving the incident infrared flux and converting the infrared flux into a heat flux;
    (c) a thermal sensing element in communication with the absorber and responsive to the heat flux, the absorber being laminated onto the thermal sensing element, and the thermal sensing element being configured to convert the heat flux into an electrical signal and comprising a contact region that outputs the electrical signal to the readout region; and
    (d) at least one bridge comprising an electrically conducting layer, each bridge supporting the thermal sensing element above the substrate and forming a gap between the thermal sensing element and the substrate, each bridge being tilted with respect to the surface of the substrate and disposed beneath the absorber so that the respective bridge is hidden by the absorber when viewed from above the absorber.

6. The thermal infrared sensor of claim 5, wherein the thermal sensing element is selected from a group consisting of resistance-type bolometers, Schottky barrier thermistors, pyroelectric sensors, thermocouples, and thermopiles.

7. The thermal infrared sensor of claim 5, wherein the electrically conducting layer of each bridge is a titanium layer.

8. The thermal infrared sensor of claim 5, wherein the electrically conducting layer of each bridge is electrically connected to the contact region and to the readout region.

9. The thermal infrared sensor of claim 5, further comprising:
    a first support connected to each respective bridge and the substrate, the first support holding the respective bridge above the substrate, and the first support comprising an electrically conducting layer; and
    a second support connected to each respective bridge and the thermal sensing element, the second support holding the thermal sensing element above the respective bridge, and the second support comprising an electrically conducting layer.

10. The thermal infrared sensor of claim 9, wherein each bridge is a portion of a plane-parallel plate and is held approximately parallel to the substrate.

11. The thermal infrared sensor of claim 9, wherein each of the first support and second supports comprises a tungsten layer.

* * * * *

UNITED STATES PATENT AND TRADEMARK OFFICE
CERTIFICATE OF CORRECTION

PATENT NO.    : 6,034,374
DATED         : March 7, 2000
INVENTOR(S)   : Kimura et al.

Page 1 of 1

It is certified that error appears in the above-identified patent and that said Letters Patent is hereby corrected as shown below:

<u>In the Abstract:</u>

On line 3 of the Abstract, "including" should be --comprising--.

<u>Column 17</u>:
Line 37, "50G" should be --SOG--.
Line 38, "region 92" should be --region 97-2--.

Signed and Sealed this

Twelfth Day of June, 2001

*Attest:*

NICHOLAS P. GODICI
*Attesting Officer*     *Acting Director of the United States Patent and Trademark Office*